US009653655B2

(12) United States Patent
Thompson et al.

(10) Patent No.: US 9,653,655 B2
(45) Date of Patent: May 16, 2017

(54) LIGHT EMITTING DIODES WITH ZINC OXIDE CURRENT SPREADING AND LIGHT EXTRACTION LAYERS DEPOSITED FROM LOW TEMPERATURE AQUEOUS SOLUTION

(75) Inventors: Daniel B. Thompson, Walnut Creek, CA (US); Jacob J. Richardson, Santa Barbara, CA (US); Steven P. DenBaars, Goleta, CA (US); Frederick F. Lange, Santa Barbara, CA (US); Jin Hyeok Kim, Kwangju (KR); MaryAnn E. Lange, legal representative, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 12/939,044

(22) Filed: Nov. 3, 2010
(Under 37 CFR 1.47)

(65) Prior Publication Data

US 2011/0101414 A1   May 5, 2011

Related U.S. Application Data

(60) Provisional application No. 61/257,814, filed on Nov. 3, 2009, provisional application No. 61/257,811, filed
(Continued)

(51) Int. Cl.
*H01L 33/44* (2010.01)
*H01L 33/14* (2010.01)
(Continued)

(52) U.S. Cl.
CPC ............ *H01L 33/44* (2013.01); *H01L 33/14* (2013.01); *H01L 33/28* (2013.01); *H01L 33/32* (2013.01);
(Continued)

(58) Field of Classification Search
None
See application file for complete search history.

(56) References Cited

U.S. PATENT DOCUMENTS

| 3,721,611 A | 3/1973 | Jones |
| 6,458,673 B1 | 10/2002 | Cheung |

(Continued)

FOREIGN PATENT DOCUMENTS

| CN | 101319370 | 12/2008 |
| CN | 101504961 | 8/2009 |

OTHER PUBLICATIONS

An, S. et al., "Enchanced light output of GaN-based light-emitting diodes with ZnO nanorod arrays," Applied Physics Letters 92, 121108 (2008).

(Continued)

*Primary Examiner* — Abul Kalam
(74) *Attorney, Agent, or Firm* — Gates & Cooper LLP

(57) ABSTRACT

A method for fabricating a Light Emitting Diode (LED) with increased light extraction efficiency, comprising providing a III-Nitride based LED structure comprising a light emitting active layer between a p-type layer and an n-type layer; growing a Zinc Oxide (ZnO) layer epitaxially on the p-type layer by submerging a surface of the p-type layer in a low temperature aqueous solution, wherein the ZnO layer is a transparent current spreading layer; and depositing a p-type contact on the ZnO layer. The increase in efficiency may be more than 93% with very little or no increase in cost.

27 Claims, 16 Drawing Sheets

Related U.S. Application Data on Nov. 3, 2009, provisional application No. 61/257,812, filed on Nov. 3, 2009.

(51) Int. Cl.

| | |
|---|---|
| *H01L 33/28* | (2010.01) |
| *H01L 33/32* | (2010.01) |
| H01L 33/40 | (2010.01) |
| H01L 21/288 | (2006.01) |
| H01L 33/00 | (2010.01) |

(52) U.S. Cl.
CPC .......... *H01L 21/288* (2013.01); *H01L 33/007* (2013.01); *H01L 33/40* (2013.01)

(56) References Cited

U.S. PATENT DOCUMENTS

| | | | |
|---|---|---|---|
| 7,265,037 | B2 | 9/2007 | Yang et al. |
| 7,767,140 | B2 | 8/2010 | Min et al. |
| 2003/0084838 | A1* | 5/2003 | McCandlish et al. .......... 117/68 |
| 2004/0089868 | A1* | 5/2004 | Hon et al. ...................... 257/79 |
| 2004/0105810 | A1 | 6/2004 | Ren et al. |
| 2004/0265507 | A1 | 12/2004 | Xiong et al. |
| 2005/0009224 | A1* | 1/2005 | Yang et al. .................... 438/57 |
| 2005/0179051 | A1 | 8/2005 | Kondoh et al. |
| 2005/0179052 | A1 | 8/2005 | Yi et al. |
| 2006/0261323 | A1 | 11/2006 | Suh et al. |
| 2007/0001186 | A1* | 1/2007 | Murai et al. .................... 257/98 |
| 2007/0222353 | A1 | 9/2007 | Ren et al. |
| 2008/0073659 | A1* | 3/2008 | Tamura et al. ................. 257/97 |
| 2009/0052159 | A1 | 2/2009 | Abe et al. |
| 2009/0098043 | A1* | 4/2009 | Song et al. ................... 423/622 |
| 2010/0038638 | A1* | 2/2010 | Tao et al. ........................ 257/43 |
| 2010/0263586 | A1 | 10/2010 | Richardson et al. |
| 2010/0308323 | A1* | 12/2010 | Chang Jean et al. ........... 257/43 |
| 2011/0089398 | A1* | 4/2011 | Pan et al. ........................ 257/13 |
| 2011/0127551 | A1* | 6/2011 | Pan et al. ........................ 257/98 |

OTHER PUBLICATIONS

Elmmer, K. et al., "Resistivity of polycrystalline zinc oxide films: current status and physical limit," Journal of Physics D. 34(21), 2001, pp. 3097-3108.

Kim, K. et al., "Enhanced light extraction efficiency of GaN-based light-emitting diodes with ZnO nanorod arrays grown using aqueous solution," Applied Physics Letters 94, 071118 (2009).

Lange, F., "Chemical solution routes to single-crystal thin films," Science, vol. 273, No. 5277, Aug. 16, 1996, pp. 903-909.

Perkins et al.; "A Liquid-Phase Quartz Crystal Microbalance for Photovoltaics Research," National Renewable Energy Laboratory, May 2008, pp. 1-8.

Richardson, J. et al., "Controlling low temperature aqueous synthesis of ZnO. 2. A novel continuous circulation reactor," Crystal Growth & Design, vol. 9, No. 6, 2009, pp. 2576-2581.

Schmidt-Mende et al.; "ZnO—nanostructures, defects, and devices," Department of Materials Science, vol. 10, No. 5, May 2007, pp. 40-48.

Sounart et al.; "Sequential Nucleation and Growth of Complex Nanostructured Films," Advanced Functional Materials, vol. 16, 2006, pp. 335-344.

Zhong, J. et al., "Integrated ZnO nanotips of GaN light emitting diodes for enhanced emission efficiency," Applied Physics Letters 90, 203515 (2007).

International Search Report and Written Opinion of the International Searching Authority mailed on Jun. 28, 2010 for International Application No. PCT/US10/31286.

International Search Report and Written Opinion of the International Searching Authority mailed on Dec. 30, 2010 for International Application No. PCT/US2010/055293.

International Search Report and Written Opinion of the International Searching Authority mailed on Dec. 30, 2010 for International Application No. PCT/US2010/055278.

Richardson, J. et al., "Controlling low temperature aqueous synthesis of ZnO. 1. Thermodynamic analysis," Crystal Growth & Design, 2009, vol. 9, No. 6, 2570-2575.

Andeen, D. et al., "Crystal chemistry of epitaxial ZnO on (1 1 1) $MgAl_2O_4$ produced by hydrothermal synthesis," Journal of Crystal Growth 259 (2003) 103-109.

Chang, K. et al., "Investigation of indium-tin-oxide ohmic contact to p-GaN and its application to high-brightness GaN-based light-emitting diodes," Solid-State Electronics 49 (2005) 1381-1386.

Horng, R. et al., "GaN-based light-emitting diodes with indium tin oxide texturing window layers using natural lithography," Applied Physics Letters 86, 221101 (2005).

Kim, J. et al., "Growth of heteroepitaxial ZnO thin films on GaN-buffered $Al_2O_3$ (0001) substrates by low-temperature hydrothermal synthesis at 90° C.," Adv. Funct. Mater. 2007, 17, 463-471.

Li, W. et al., "Growth mechanism and growth habit of oxide crystals," Journal of Crystal Growth 203 (1999) 186-196.

Margalith, T. et al., "Indium tin oxide contacts to gallium nitride optoelectronic devices," Applied Physics Letters, vol. 74, No. 26, Jun. 28, 1999, 3930.

Mariano, A. et al., "Crystallographic polarity of ZnO crystals," Journal of Applied Physics, vol. 34, No. 2, Feb. 1963, 384.

Murai, A. et al., "Hexagonal pyramid shaped light-emitting diodes based on ZnO and GaN direct wafer bonding," Applied Physics Letters 89, 171116 (2006).

Murai, A. et al., "Mega-cone blue LEDs based on ZnO/GaN direct wafer bonding," Phys. Stat. Sol. (c) 4, No. 7, 2756-2759 (2007).

Nakahara, K. et al., "Improved external efficiency InGaN-based light-emitting diodes with transparent conductive Ga-doped ZnO as p-electrodes," Japan Society of Applied Physics, vol. 43, No. 2A, 2004, pp. L180-L182.

Oner, M. et al., "Control of ZnO crystallization by a PEO-b-PMAA diblock copolymer," Chem. Mater. 1998, 10, 460-463.

Richardson, J. et al., "Low temperature aqueous deposition of ZnO of GaN LEDs," SSLEC Annual Review, Nov. 5, 2009.

Sheu, J. et al., "Enhanced efficiency of GaN-based light-emitting diodes with periodic textured Ga-doped ZnO transparent contact layer," Applied Physics Letters 90, 263511 (2007).

Song, J. et al., "High low resistance and transparent Ni/ZnO ohmic contacts to p-type GaN," Applied Physics Letters, vol. 83, No. 3, Jul. 21, 2003, 479.

Thompson, D. et al., ABSt $7^{th}$ Int. Conf. Nitride Semiconductors, 2007, A3, p. 12.

Thompson, D. et al., "Light emitting diodes with ZnO current spreading layers deposited from a low temperature aqueous solution," Applied Physics Express 2 (2009) 042101.

Tian, Z. et al., "Complex and oriented ZnO nanostructures," Nature Materials, vol. 2, Dec. 2003, 821.

Van De Walle, C. et al., "Universal alignment of hydrogen level in semiconductors, insulators and solutions," Nature, vol. 423, Jun. 5, 2003, 626.

Norwig et al., "Control of ZnO Crystallization by a PEO-b-PMAA Diblock Copolymer". Chem. Mater. 1998, 10, pp. 460-463.

Richardson, Jacob J., et al., "Thermally Induced Pore Formation in Epitaxial ZnO Films Grown from Low Temperature Aqueous Solution", Crystal Growth & Design, 2011, pp. 3558-3563, vol. 11.

Chinese Office Action (with English translation) dated Apr. 30, 2014 for Chinese Patent Application No. 201080049857.2.

\* cited by examiner

LIGHT EMITTING DIODES WITH ZINC OXIDE CURRENT SPREADING AND LIGHT EXTRACTION LAYERS DEPOSITED FROM LOW TEMPERATURE AQUEOUS SOLUTION

CROSS REFERENCE TO RELATED APPLICATIONS

This application claims priority under 35 U.S.C. §119(e) to the following commonly-assigned U.S. Provisional Patent Applications:

U.S. Provisional Patent Application Ser. No. 61/257,814, entitled "LIGHT EMITTING DIODES WITH ZINC OXIDE CURRENT SPREADING AND LIGHT EXTRACTION LAYERS DEPOSITED FROM LOW TEMPERATURE AQUEOUS SOLUTION," filed on Nov. 3, 2009, by Daniel B. Thompson, Jacob J. Richardson, Steven P. DenBaars, Frederick F. Lange, and Jin Hyeok Kim;

U.S. Provisional Application Ser. No. 61/257,811, filed on Nov. 3, 2009, by Jacob J. Richardson, Daniel B. Thompson, Ingrid Koslow, Jun Seok Ha, Frederick F. Lange, Steven P. DenBaars, and Shuji Nakamura, entitled "A LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,"; and U.S. Provisional Application Ser. No. 61/257,812, filed on Nov. 3, 2009, by Daniel B. Thompson, Jacob J. Richardson, Ingrid Koslow, Jun Seok Ha, Frederick F. Lange, and Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION,";

which applications are incorporated by reference herein.

This application is related to the following commonly-assigned U.S. patent applications:

U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS,", which application claims priority under 35 U.S.C. §119(e) to and commonly-assigned U.S. Provisional Patent Application Ser. No. 61/169,633, filed on Apr. 15, 2009, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS,";

U.S. Utility Application Ser. No. 12/938,872 filed on Nov. 3, 2010, issued as U.S. Pat. No. 8,536,618 on Sep. 17, 2013, by Jacob J. Richardson, Daniel B. Thompson, Ingrid Koslow, Jun Seok Ha, Frederick F. Lange, Steven P. DenBaars, and Shuji Nakamura, entitled "LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,", which application claims priority under 35 U.S.C. §119(e) to commonly-assigned U.S. Provisional Application Ser. No. 61/257,811, filed on Nov. 3, 2009, by Jacob J. Richardson, Daniel B. Thompson, Ingrid Koslow, Jun Seok Ha, Frederick F. Lange, Steven P. DenBaars, and Shuji Nakamura, entitled "LIGHT EMITTING DIODE STRUCTURE UTILIZING ZINC OXIDE NANOROD ARRAYS ON ONE OR MORE SURFACES, AND A LOW COST METHOD OF PRODUCING SUCH ZINC OXIDE NANOROD ARRAYS,";

which applications are incorporated by reference herein.

U.S. Utility Application Ser. No. 12/938,948 filed on Nov. 3, 2010, issued as U.S. Pat. No. 8,637,334 on Jan. 28, 2014, by Daniel B. Thompson, Jacob J. Richardson, Ingrid Koslow, Jun Seok Ha, Frederick F. Lange, Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION,", which application claims priority under 35 U.S.C. §119(e) to commonly-assigned U.S. Provisional Application Ser. No. 61/257,812, filed on Nov. 3, 2009, by Daniel B. Thompson, Jacob J. Richardson, Ingrid Koslow, Jun Seok Ha, Frederick F. Lange, Steven P. DenBaars, and Shuji Nakamura, entitled "HIGH BRIGHTNESS LIGHT EMITTING DIODE COVERED BY ZINC OXIDE LAYERS ON MULTIPLE SURFACES GROWN IN LOW TEMPERATURE AQUEOUS SOLUTION,";

which applications are incorporated by reference herein.

BACKGROUND OF THE INVENTION

1. Field of the Invention

This invention relates to a zinc oxide (ZnO) based transparent current spreading and light extraction layer for Group III-Nitride (III-N) Light Emitting Diodes (LEDs), a low temperature aqueous solution method for producing ZnO based transparent current spreading and light extraction layers, and a LED device structure formed by combining a ZnO based transparent current spreading layer with a III-N LED.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Maximizing light extraction is crucial for energy efficient, high brightness light emitting diodes (LEDs). In III-N based LEDs, the typically low electrical conductivity of the p-type layer can result in much higher current injection into the active layers, and thus light generation, near the point of electrical contact. This presents several problems for light extraction and device efficiency. Because most of the light generated is emanating from directly under the opaque metal contact, a large portion is blocked by the contact. Much of the light that is not blocked by the contact intersects the LED surface outside the so called "cone of escape" defined by Snell's Law. Light that is outside of the "cone of escape" undergoes total internal reflection and is thus trapped inside the LED. In addition, the high current density caused by the localized injection near the contact gives rise to heating and other effects that reduce the internal quantum efficiency of the device. The application of a transparent current spreading layer to the surface of an LED can improve these problems in several ways. A transparent current spreading layer distributes current across the surface of the LED, due to a high conductivity, while absorbing very little of the light being generated, due to a high transparency. When possessing certain properties of structure and or refractive index, transparent current spreading layers can also enhance light extraction by reducing the amount of light that is prevented from the escaping the LED due to refraction and reflection at the LED interfaces.

It has been shown that transparent conducting oxide (TCO) films consisting of indium-tin-oxide (ITO) [5,6], ZnO [7], or aluminum-doped-zinc-oxide (AZO) [8], improve external quantum efficiency when applied to the surface of III-N LEDs as transparent current spreading layers. It has also been shown that several methods of TCO layer surface roughening can further improve light extraction from LEDs [9,10]. However, the added cost of depositing and roughening the surface of such TCO layers can largely diminish the commercial advantage of the performance enhancements achieved by these techniques. The current state of the art TCO material for LED current spreading layers, indium-tin-oxide (ITO), has several drawbacks related to cost. First, due to the high price and limited supply of indium, ITO has a high raw material cost which is subject to large fluctuations with demand. In addition, ITO is typically deposited and roughened using techniques that utilize low pressure controlled atmospheres and high power electronics. The expense of the required equipment and energy add significant processing costs to the already high raw materials cost for ITO. Zinc oxide based TCO materials can drastically reduce the cost of raw materials compared to ITO. In addition, ZnO can be synthesized [11] and etched [2,3] using comparatively inexpensive aqueous solution based techniques.

Zinc oxide (ZnO) is an optically transparent, wide band gap semiconductor. A band gap of 3.3 eV, an exciton binding energy of 60 meV, large breakdown strength, and a large saturation velocity have led to interest in ZnO as a possible candidate for use in light emitting devices and other high-power density, high-temperature semiconducting devices. In order to be used in such devices, high quality epitaxial ZnO thin films will typically be required. Many of these applications will also require the ability to produce both n-type and p-type ZnO. Unfortunately, ZnO has a strong tendency for n-type behavior and stable, reliable, and reproducible p-type ZnO has proven extremely difficult to produce. However, the tendency for high n-type conductivity combined with the high optical transparency of ZnO make it very well suited for use as a transparent conductive oxide. Like most inorganic material films used in the semiconductor industry, any ZnO films used are currently produced using vapor phase methods such as molecular beam epitaxy (MBE), pulsed laser deposition (PLD), sputtering, and metal organic chemical vapor deposition (MOCVD). However, it is also possible to produce ZnO films, including epitaxial films, using low temperature aqueous solution methods[11, 16,17,18].

Because the general simplicity of the required equipment, along with the low temperatures and atmospheric pressure used, low temperature aqueous solution methods present significant cost advantages over vapor phase deposition techniques. Aqueous solution methods have been used for some time to produce ZnO powders and polycrystalline films, but more recently, it has been shown that epitaxial ZnO films can also be produced using low temperature aqueous solution methods. In general, an epitaxial film will be more transparent and have higher conductivity than a polycrystalline film of the same composition, due to the lack of grain boundaries. However, the current state of the art transparent current spreading layer technology uses a polycrystalline ITO film. Because of the dissimilar crystal structures of III-N materials and ITO, epitaxial film deposition of ITO is generally not possible. Zinc oxide, on the other hand, has the same Wurtzite crystal structure as the III-N materials used in LEDs, making epitaxial growth is possible by numerous deposition methods, including low temperature aqueous solution methods.

SUMMARY OF THE INVENTION

The present invention describes a light emitting diode structure which utilizes an epitaxial ZnO film produced using a low temperature aqueous deposition method as a current spreading and light extraction layer. In addition, the invention describes a method for producing such ZnO current spreading layers. This includes ZnO layers that have been synthesized in such a way as to form, or subsequently treated to establish, a structured or roughened surface for the purpose of enhancing light extraction and/or heat dissipation from the LED. This also includes ZnO layers that have been synthesized in such a way as to have, or subsequently treated to establish, high electrical conductivity. The method presented here for producing ZnO current spreading layers is a simple, low cost, low temperature aqueous solution based route. This route can be used to produce ZnO layers on LEDs fabricated on either hetero-epitaxial or homo-epitaxial substrates, where either lateral (mesa) or vertical type device architectures are utilized.

The properties of an embodiment of this invention have been demonstrated (see also [12]). At a current of 20 mA and a voltage of 3.32V, the output power of the reported structure was 20.7 mW, with an external quantum efficiency (EQE) of 37.7%. This represents a factor of 1.93 improvement over an identical LED using a conventional semi-transparent Ni/Au electrode, and performance similar to an identical LED using a conventional ITO current spreading layer.

Thus, to overcome the limitations in the prior art, and to overcome other limitations that will become apparent upon reading and understanding the present specification, the present invention discloses an (LED) comprising a plurality of III-Nitride layers comprising a III-Nitride light emitting active layer between a III-Nitride p-type layer and a III-Nitride n-type layer; and an epitaxial Zinc Oxide (ZnO) layer over an outermost layer of the III-Nitride layers of the LED, wherein the ZnO layer is deposited from a low temperature aqueous solution and the ZnO layer enhances current spreading in and/or light extraction from, the LED.

The III-Nitride layers may be deposited on a heteroepitaxial single crystal substrate or on a homoepitaxial single crystal substrate.

The LED may comprise a mesa type LED structure or a vertical type LED structure.

A surface of the ZnO layer may be roughened, patterned, or structured, either during, or subsequent to, deposition of the ZnO layer on the outermost III-Nitride layer, in order to enhance the light extraction of the LED. The roughened, patterned, or structured surface of the ZnO layer may comprise hexagonal pyramids or pits exposing semipolar crystal planes of ZnO.

The present invention further discloses a method of fabricating one or more epitaxial ZnO layers on III-Nitride LED, comprising depositing or synthesizing the ZnO layers from a low temperature aqueous solution (e.g., growth solution) containing dissolved Zn(II), by means of a chemical reaction involving the dissolved Zn(II), to form a ZnO layer on a III-Nitride surface of the LED.

A maximum temperature of the aqueous solution may be less than 100° C.

A maximum temperature of the aqueous solution may be less than the boiling point of the aqueous solution, wherein that boiling point may be greater or less than 100° C.

The dissolved Zn(II) in the aqueous solution may be supplied by dissolving a water soluble salt of Zn(II) or by dissolving ZnO.

The deposition of the ZnO layer may be performed in one or more steps, such that, in any one or more of the steps, the reaction of the dissolved Zn(II) to form ZnO is caused, intensified, or otherwise controlled by an increase in a temperature of the growth solution, or by a change in a pH of the growth solution.

The method may further comprise controlling the morphology of the ZnO layers by creating one or more roughened, patterned, or structured surfaces of the ZnO layers suitable for enhancing light extraction of light emitted by the LED.

The creation of the roughened, patterned, or structured surface may include one or more steps involving a removal of material from the preformed ZnO layers by means of physical or chemical etching. Conditions of the physical or chemical etching used may result in the ZnO surfaces of the ZnO layers comprising hexagonal pyramids or pits exposing semipolar planes of the ZnO crystal.

The roughened, patterned, or structured surfaces of the ZnO layers may be created during the step of synthesizing the ZnO layers. The roughened, patterned, or structured surfaces may be a result of conditions of used during the step of synthesizing the ZnO layers. Conditions used during the step of depositing or synthesizing the ZnO layers result in the ZnO surfaces comprising hexagonal pyramids or pits exposing semipolar planes of the ZnO crystal.

The method may further comprise etching the III-Nitride surface, or creating a template layer on the III-Nitride surface; and performing the step of synthesizing or depositing the ZnO layers on the template layer or on the etched III-Nitride surface, wherein the roughened, patterned, or structured ZnO surfaces are a result of the etching or template creation step performed prior to the step of synthesizing the ZnO layers.

The morphology of the ZnO layers produced may be modified by an addition of additives to the aqueous solution, wherein the additives include one or more of the following: metal citrate salts, citric acid, surfactants, polymers, biomolecules, or other molecules that interact with one or more surfaces of the ZnO layers.

The morphology of the ZnO layers produced by the addition of the additives to the aqueous solution may enhance light extraction from the LED.

One or more components may be supplied in the aqueous solution for a purpose of incorporating one or more dopants into the ZnO layers. At least one of the dopants may be from the group comprising Boron (B), Aluminum (Al), Gallium (Ga), and Indium (In). Incorporation of the dopants may modify one or more electrical properties of the ZnO layers.

The method may further comprise at least one annealing step performed subsequent to the step of depositing or synthesizing the ZnO layers in the aqueous solution. The annealing step may modify one or more electrical properties of the ZnO layers. The annealing step may comprise heating the ZnO layers to a temperature greater than a maximum temperature used during the step of depositing the ZnO layers in the aqueous solution.

The present invention further discloses a transparent current spreading layer comprising, in part or wholly, of an epitaxial ZnO film deposited from a low temperature aqueous solution.

The present invention further discloses a device, comprising a ZnO layer used as a transparent current spreading layer for the device, wherein the ZnO layer is deposited from a low temperature aqueous solution and the ZnO layer is transparent to light wavelengths generated and emitted by the device.

The combination of high electrical conductivity, light transmission, surface texturing and ease/economics of low temperature water processing would be useful for developing low cost top electrodes for GaN LED devices.

BRIEF DESCRIPTION OF THE DRAWINGS

Referring now to the drawings in which like reference numbers represent corresponding parts throughout:

FIGS. 12(a)-12(c) show the electrical properties of a ZnO film deposited by the method of the present invention as a function of annealing temperature, wherein FIG. 12(a) shows the sheet resistance, FIG. 12(b) shows the electrical carrier concentration, and FIG. 12(c) shows the electrical mobility of a ZnO film.

DETAILED DESCRIPTION OF THE INVENTION

Figure 1:
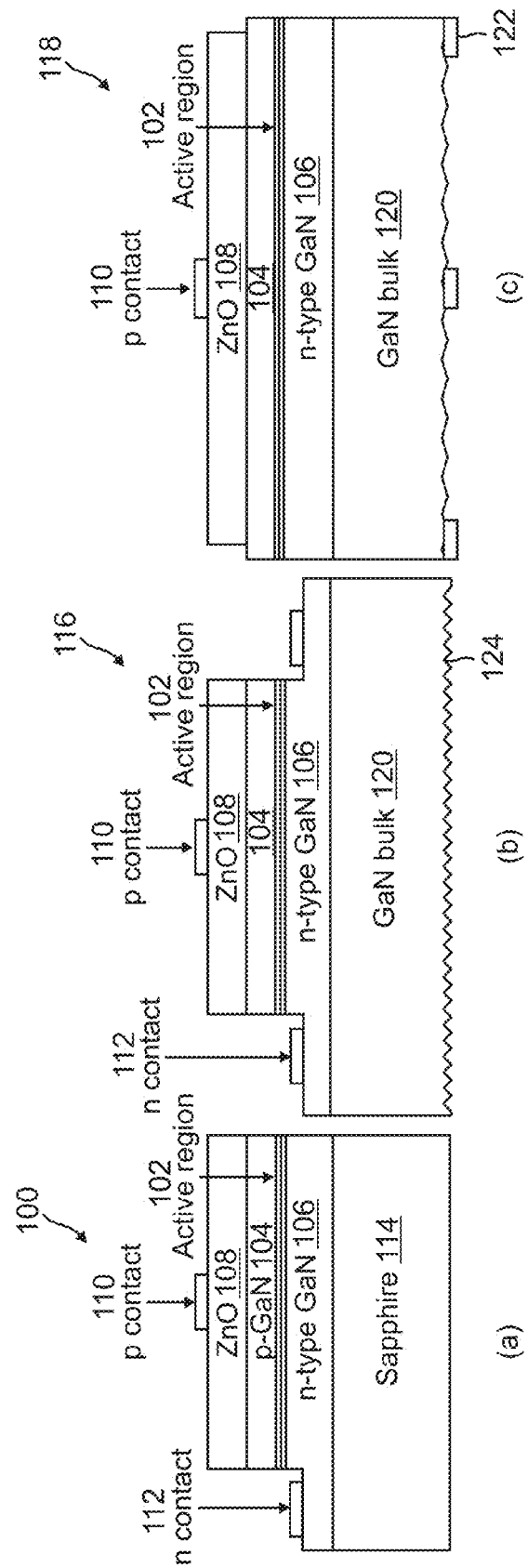
FIG. 1 shows schematic cross sectional images of the LED structure (a) for the sapphire substrate (b) for the GaN bulk substrate and (c) for the vertical type LED, according to the present invention.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The purpose of this invention is to improve the performance of III-N LEDs though the addition of ZnO layers to the LEDs' surfaces. These layers can improve the light extraction, heat dissipation, and current distribution (current spreading) of the device. Structuring, patterning, or roughening of the ZnO layers, either during or subsequent to synthesis, is anticipated to further improve the light extraction and heat dissipation enhancements possible using these films. Due to growing energy concerns, efficient LED lighting technology is of current and expanding importance. However, the cost of LED lighting remains high and is a major impediment to the greater implementation of the technology. This invention is intended to allow the power output, light extraction efficiency, and brightness of III-Nitride light emitting diodes to be increased without substantially increasing the cost of the device. This can be achieved with the current invention by matching or exceeding the performance of other current spreading layers, e.g. ITO or Ni/Au layer, but doing so using an inexpensive raw material, i.e. ZnO, and a low cost deposition method, i.e. low temperature aqueous deposition.

ZnO is an attractive material for use as current spreading layers in III-Nitride based light emitting diodes for multiple reasons. The two materials are structurally and thermally compatible, which allows for the epitaxial growth of ZnO films on III-N surfaces. Zinc oxide is easily produced with high n-type conductivity, which enables a ZnO film to spread current across the surface of a light emitting diode. ZnO is also highly transparent across the entire spectrum of visible light, which prevents absorption of the light generated by the light emitting diode. A valence band offset of 1.3 eV compared to GaN [1] allows for the possibility of tunneling current across a p-type GaN and ZnO junction, thus providing an Ohmic electrical contact between p-type GaN and ZnO. Furthermore, ZnO selectively etches in various acids, allowing for light extraction structures to be easily created [2-4].

Although the intrinsic conductivity of the ZnO produced by the method of the present invention may not necessarily match that of the ITO material used for current spreading layers, the current spreading capability of the ZnO layer can be as good as, or better than, typical ITO current spreading layers. This is possible due to much greater thickness of the ZnO layers of the present invention compared to typical ITO current spreading layers. ITO layers must be made relatively thin due to higher light absorption compared to the ZnO of the present invention. The higher thickness of the ZnO layers also facilitates roughening, patterning, or structuring of the ZnO in order to enhance light extraction.

The electrical and optical output properties of an embodiment of the present invention were compared to otherwise identical III-Nitride light emitting diodes using current spreading layers composed of either 5 nm of Ni plus 10 nm of Au (see also [12]) or ITO. For the LED with the ZnO layer, which represents an embodiment of the current invention, a voltage of 3.32 V was required for an operating current of 20 mA. At an operating current of 20 mA, the optical output power of this embodiment was 20.7 mW, equating to an EQE of 37.7%. This performance is similar to the LED using the ITO film and represents a 93% improvement in efficiency over the LED with the thin metal electrode.

Technical Description

Nomenclature

III-nitrides may be referred to as group III-nitrides, nitrides, or by (Al,Ga,In)N, AlInGaN, or $Al_{(1-x-y)}In_yGa_xN$ where $0<x<1$ and $0<y<1$, for example.

These terms are intended to be broadly construed to include respective nitrides of the single species, Al, Ga, and In, as well as binary, ternary and quaternary compositions of such Group III metal species. Accordingly, the terms comprehend the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention. Accordingly, it will be appreciated that the discussion of the invention hereinafter in primary reference to GaN materials is applicable to the formation of various other (Al, Ga, In)N material species. Further, (Al,Ga,In)N materials within the scope of the invention may further include minor quantities of dopants and/or other impurity or inclusional materials. Boron may also be included in the III-nitride alloy.

Similarly, the terms zinc oxide or ZnO are intended to be broadly construed to include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (IZO). This also includes materials with minor quantities of other dopants and/or other impurity or inclusional materials, as well as materials that are off-stoichiometric due to the presence of vacancy and interstitial type material defects.

Current nitride technology for electronic and optoelectronic devices employs nitride films grown along the polar c-direction. However, conventional c-plane quantum well structures in III-nitride based optoelectronic and electronic devices suffer from the undesirable quantum-confined Stark effect (QCSE), due to the existence of strong piezoelectric and spontaneous polarizations. The strong built-in electric fields along the c-direction cause spatial separation of electrons and holes that in turn give rise to restricted carrier recombination efficiency, reduced oscillator strength, and red-shifted emission.

One approach to eliminating the spontaneous and piezoelectric polarization effects in GaN or III-nitride optoelectronic devices is to grow the devices on nonpolar planes of the crystal. Such planes contain equal numbers of Ga and N atoms and are charge-neutral. Furthermore, subsequent nonpolar layers are equivalent to one another so the bulk crystal will not be polarized along the growth direction. Two such families of symmetry-equivalent nonpolar planes in GaN or III-nitride are the {11-20} family, known collectively as a-planes, and the {1-100} family, known collectively as m-planes.

Another approach to reducing or possibly eliminating the polarization effects in GaN optoelectronic devices is to grow the devices on semi-polar planes of the crystal. The term "semi-polar planes" can be used to refer to a wide variety of planes that possess both two nonzero h, i, or k Miller indices and a nonzero 1 Miller index. Thus, semipolar planes are defined as crystal planes with nonzero h or k or i index and a nonzero l index in the (hkil) Miller-Bravais indexing convention. Some commonly observed examples of semi-polar planes in c-plane GaN heteroepitaxy include the (11-22), (10-11), and (10-13) planes, which are found in the facets of pits. Other examples of semi-polar planes in the wurtzite crystal structure include, but are not limited to, (10-12), (20-21), and (10-14). The nitride crystal's polarization vector lies neither within such planes or normal to such planes, but rather lies at some angle inclined relative to the plane's surface normal. For example, the (10-11) and (10-13) planes are at 62.98° and 32.06° to the c-plane, respectively.

The Gallium or Ga face of GaN is the $c^+$ or (0001) plane, and the Nitrogen or N-face of GaN or a III-nitride layer is the $c^-$ or (000-1) plane.

Device Structures

FIG. 1(a) illustrates an embodiment of a mesa type hetero-epitaxial lateral LED 100, comprising III-Nitride layers including a light emitting active layer or region 102 between a p-type GaN layer (p-GaN) 104 and an n-type GaN layer (n-GaN) 106; an epitaxial ZnO layer 108 over an outermost layer 104 of the III-Nitride layers of the LED 100, wherein the ZnO layer 108 is deposited from a low temperature aqueous solution containing dissolved Zn(II), such that the properties of the ZnO layer 108 allow it to function as a current spreading and light extraction layer for the light emitting diode 100. The ZnO layer 108 enhances current spreading in, and/or light extraction from, the LED 100.

Also shown are a metallic p-contact 110 on the ZnO layer 108, an n-contact 112 on the n-type GaN 106, and the n-type GaN layer 106 on a sapphire substrate 114 so that the III-Nitride layers are deposited on a heteroepitaxial single crystal substrate 114.

Other embodiments of the present invention include lateral type 116 and vertical type 118 devices structures, as shown respectively in FIGS. 1(b) and 1(c), which utilize a homoepitaxial GaN substrate 120, so that the III-Nitride layers are deposited on a homoepitaxial single crystal substrate 120. For embodiments using a homoepitaxial substrate 120, the lateral type structure 116 is similar to the heteroepitaxial structure 100 except that the sapphire substrate 114 has been replaced with the GaN substrate 120. The vertical structure 118 is similar to the lateral structure 116 except that the n-contact 112 has been removed and n-contact 122 on the GaN substrate 120 has been added. In embodiments 116 and 118, the GaN substrate 120 has also been roughened 124 for enhancing light extraction.

These types of devices can be fabricated using general procedures outlined below and in [12], but this invention should be inclusive of other LED processing techniques that will lead to the same type of device structures.

Device Properties

Figure 2A:
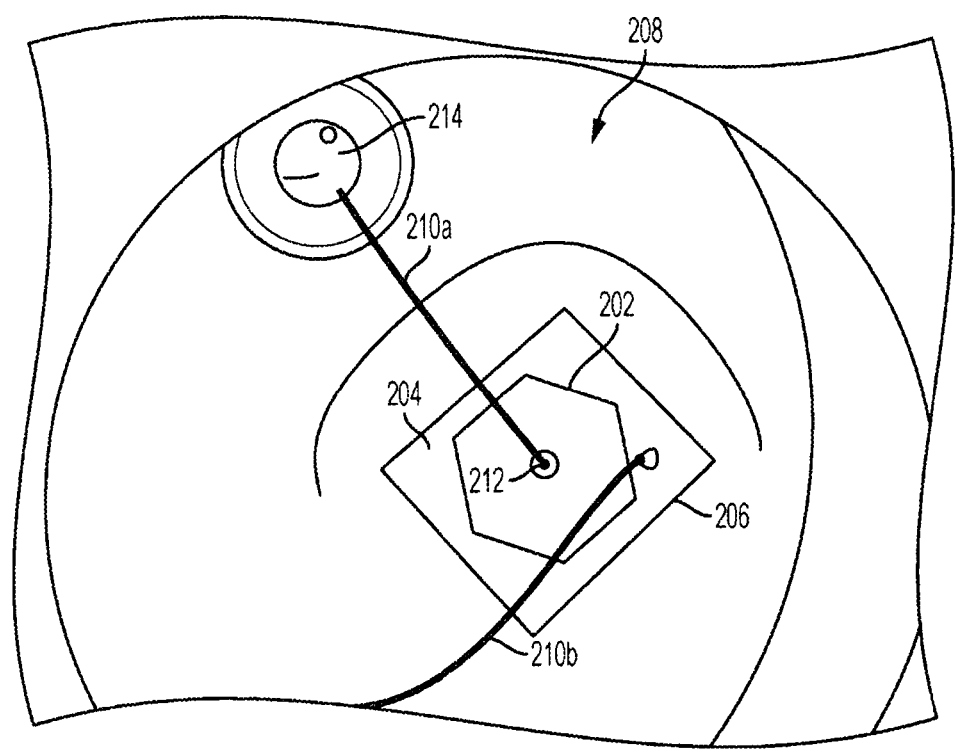
FIGS. 2(a)-2(c) are photographs of a conventional heteroepitaxial III-Nitride LED on a sapphire substrate utilizing a ZnO layer of the present invention.
Figure 2B:
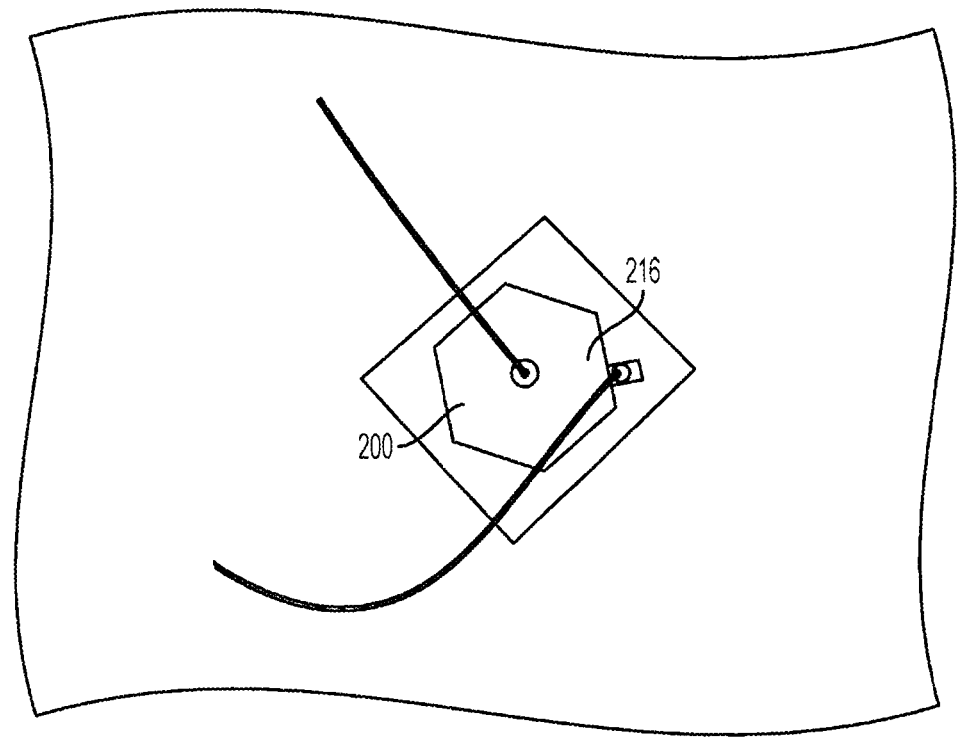
Figure 2C:
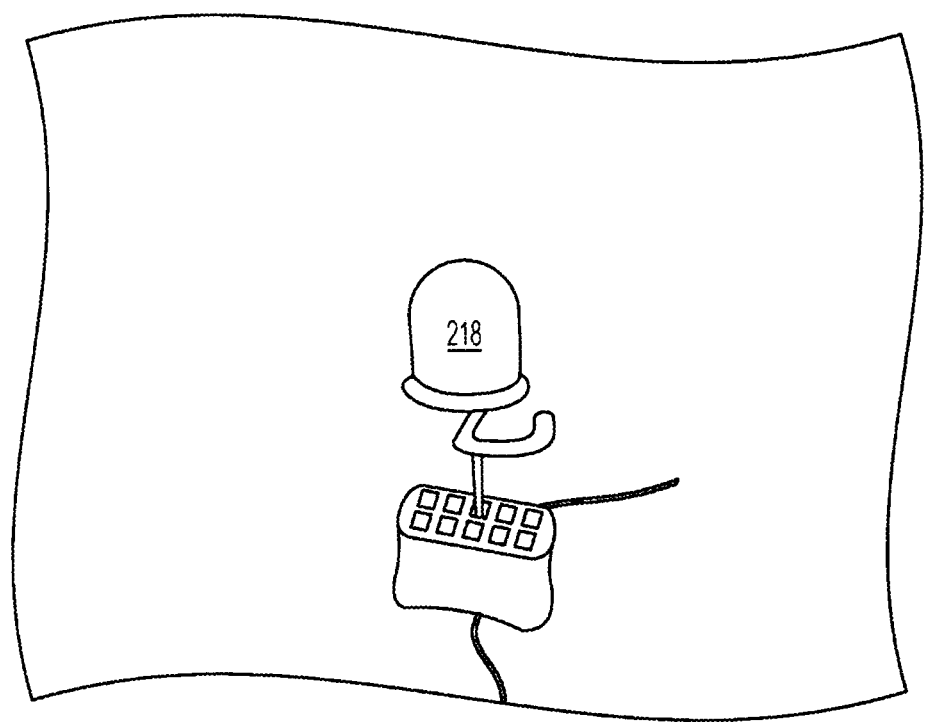

FIGS. 2(a)-(c) display a physical embodiment of the present invention in the form of a III-Nitride blue light emitting diode utilizing a ZnO layer grown from a 90° C. aqueous solution as a transparent current spreading layer for the device. The photographs in FIGS. 2(a)-(c) are top views of the LED taken with an optical microscope. FIG. 2(a) shows the LED as it appears when not in operation. The ZnO layer 200 is covering the LED mesa, which in this embodiment is hexagonal in shape. The n-contact 202 is on the n-GaN 204 and is a hexagonal ring surrounding the edge of the LED mesa. The n-GaN 204 is on sapphire. The entire (e.g., rectangular) LED chip 206 is on the silver header 208. Two gold wires, 210a and 210b, respectively connect the p-contact 212 and n-contact 202 with the electrical posts 214 on the silver header 208. FIG. 2(b) show the LED device in operation. The illumination 216 emanating from the ZnO layer 200 is not concentrated around the n-contact 202 or the p-contact 212, and is fairly uniform across the ZnO layer 200, indicating good current spreading. FIG. 2(c) shows the entire encapsulated LED 218 in operation as viewed from a distance.

Figure 3:
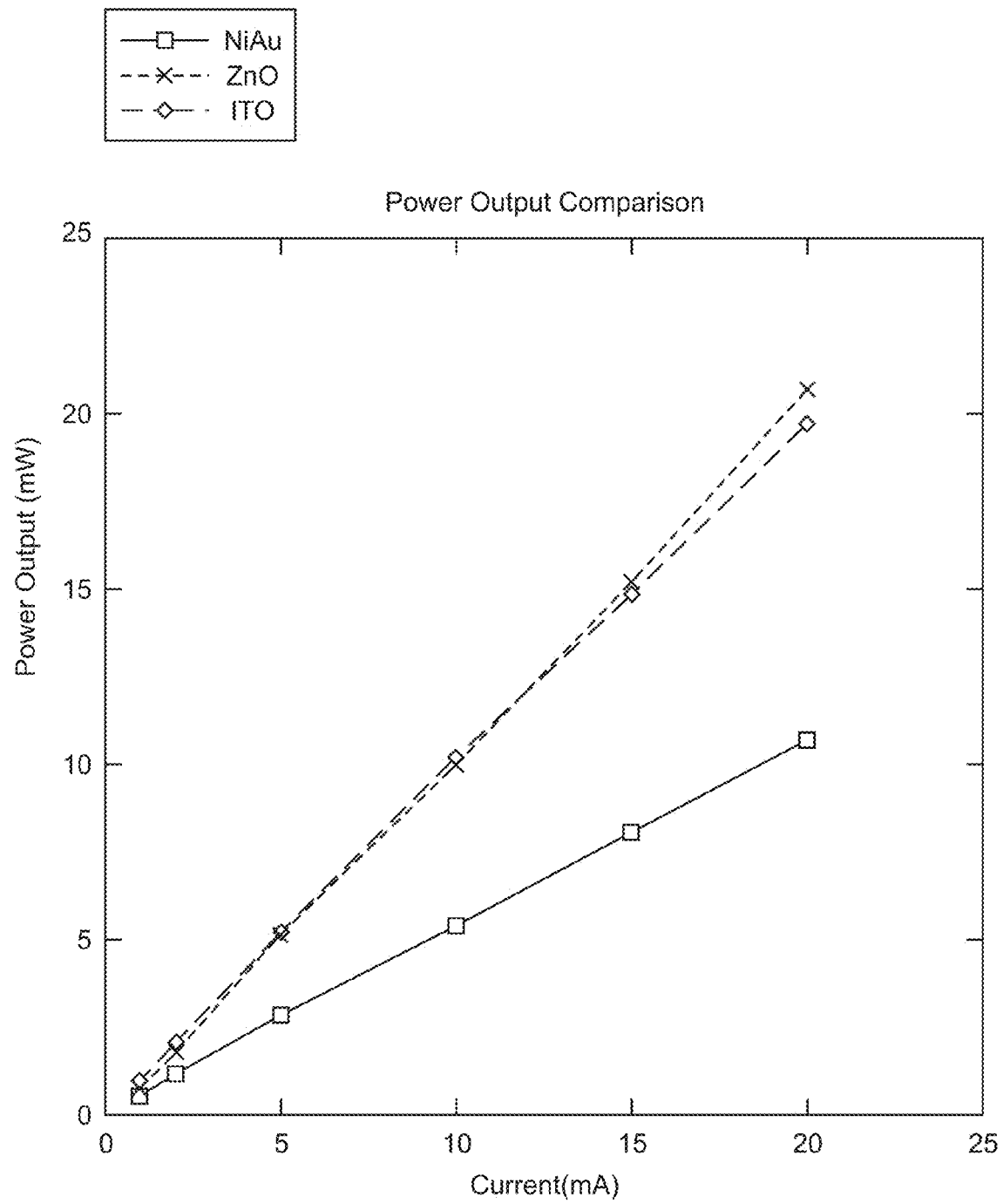
FIG. 3 is an optical output power vs. current comparison for the current spreading layers comprised of Ni/Au, ITO, and the ZnO grown by aqueous solution (according to the present invention), wherein the ZnO data represents results for the present invention.

Several device properties of an LED embodying the present invention were reported on in [12]. When compared to a device from the same wafer where a conventional semitransparent thin 5 nm Ni/10 nm Au current spreading layer was used, the ZnO coated device of the present invention showed a greater than 93% enhancement in power output. In addition, the same device has also been compared to another LED fabricated from the same wafer, this time utilizing an e-beam deposited 250 nm thick ITO transparent current spreading layer. FIG. 3 displays the output power versus current for the three LEDs (ITO layer on LED, Ni/Au layer on LED, and ZnO layer on LED), wherein the ZnO data represents the results for a device of the present invention. Measurements were performed with an integrated sphere photodetector under continuous Direct Current (DC) injection. The increase in output power with current is nearly linear, indicating minimal heating effects. At 20 mA, the LED with the ZnO layer according to the present invention emitted 20.7 mW, while the thin metal LED emitted only 10.7 mW and the ITO LED emitted 19.8 mW. The peak emission wavelength for all the LEDs was 452 nm, as expected based on the III-Nitride active layer used.

Figure 4:
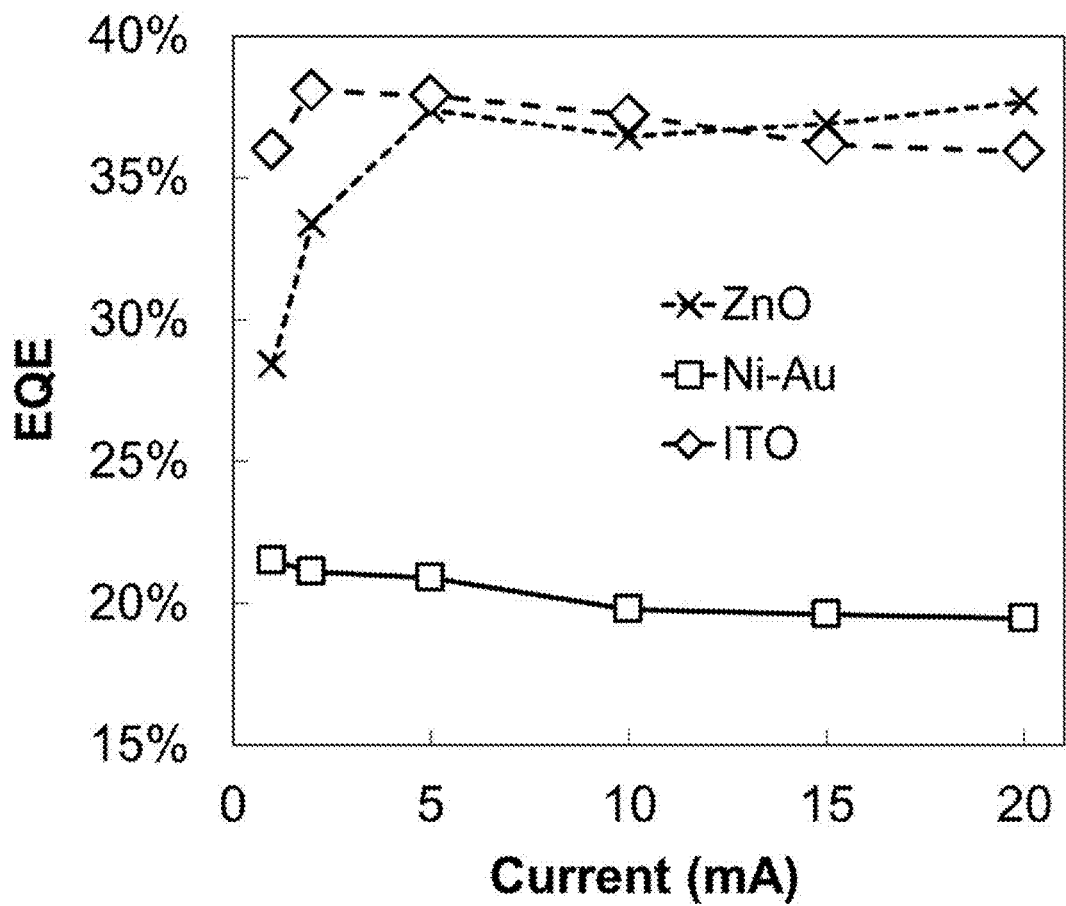
FIG. 4 displays the external quantum efficiencies (EQE) of the LEDs of FIG. 3 as a function of current, wherein the ZnO data represents results for the present invention.

FIG. 4 displays the external quantum efficiencies of the LEDs as a function of current. At 20 mA, the EQE of the LED with ZnO was 37.7%, 35.9% for the LED with ITO, and just 19.5% for the LED with Ni/Au.

Figure 5:
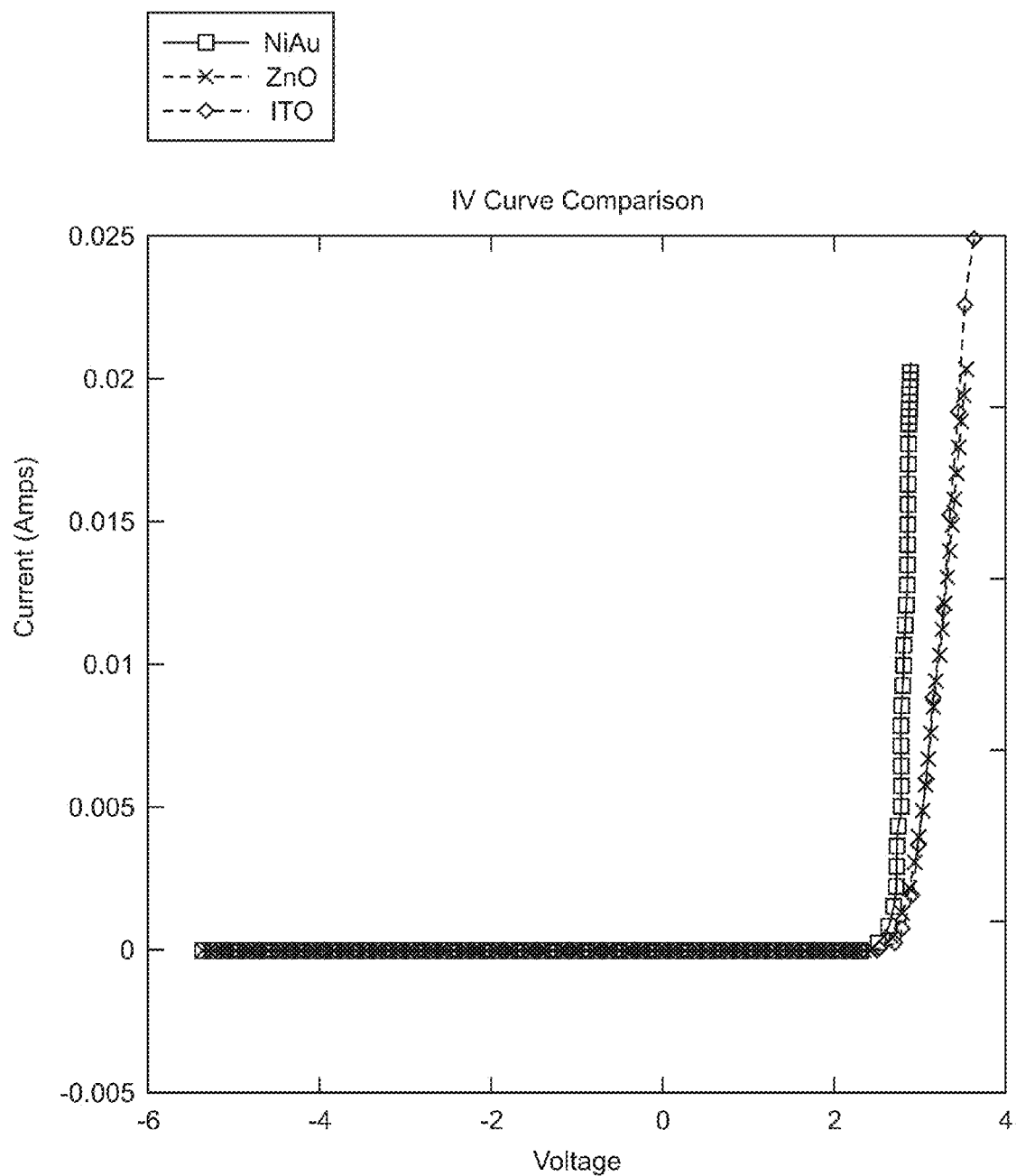
FIG. 5 shows current-voltage (I-V) characteristics of the LEDs of FIG. 3 and FIG. 4, wherein the ZnO data represents results for the present invention.

FIG. 5 shows the current versus voltage (I-V) relationship for the LEDs, wherein the ZnO data represents the results for a device of the present invention. No significant leakage current was visible. The series resistance of the LED with ZnO was approximately 32 ohm with a turn-on at 2.9V, essentially the same as the LED with ITO.

Figure 6:
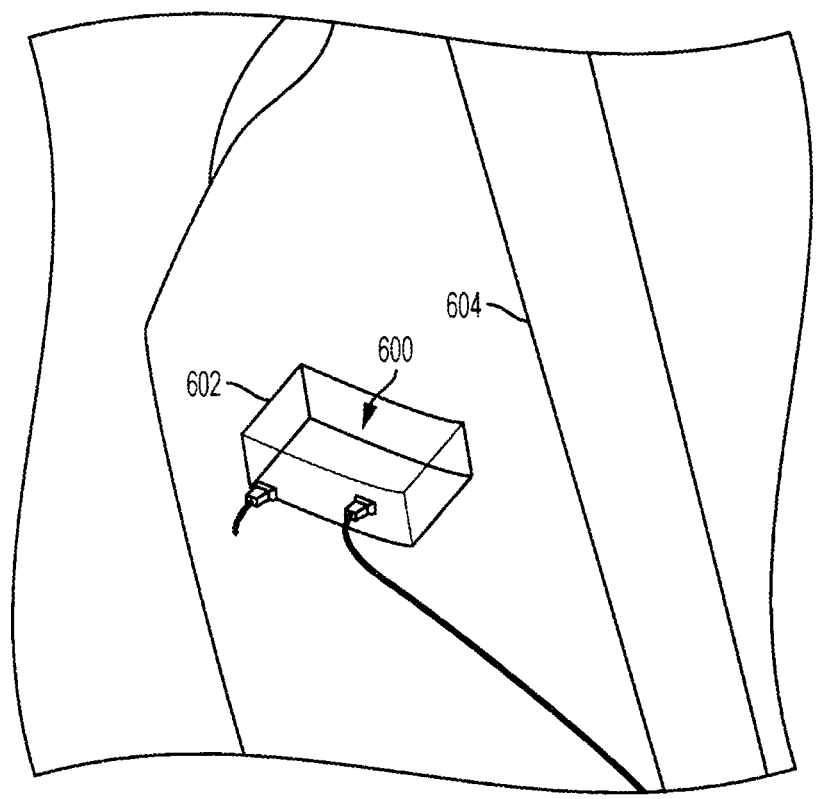
FIG. 6 is a photograph of a homoepitaxial III-Nitride LED on a bulk c-plane GaN substrate utilizing a ZnO layer of the present invention.

FIG. 6 is a photograph illustrating an embodiment of the present invention where III-Nitride LED on a homoepitaxial bulk c-plane GaN substrate 600 is used. Here, the LED chip 602 has a lateral (mesa) type architecture, corresponding to FIG. 1(b), but has been mounted in a vertical position on a vertical transparent submount 604. The ZnO transparent current spreading layer grown by the aqueous solution method of the present invention covers the LED mesa. The LED in FIG. 6 is in operation and emitting light in response to DC current injection.

In a semipolar or nonpolar LED, the III-nitride layers of the LED are grown in a semipolar or nonpolar direction of III-Nitride respectively, such that the top surface of each III-Nitride layer, or last grown surface of each III-Nitride layer, is a semipolar or nonpolar plane, respectively.

Figure 7:
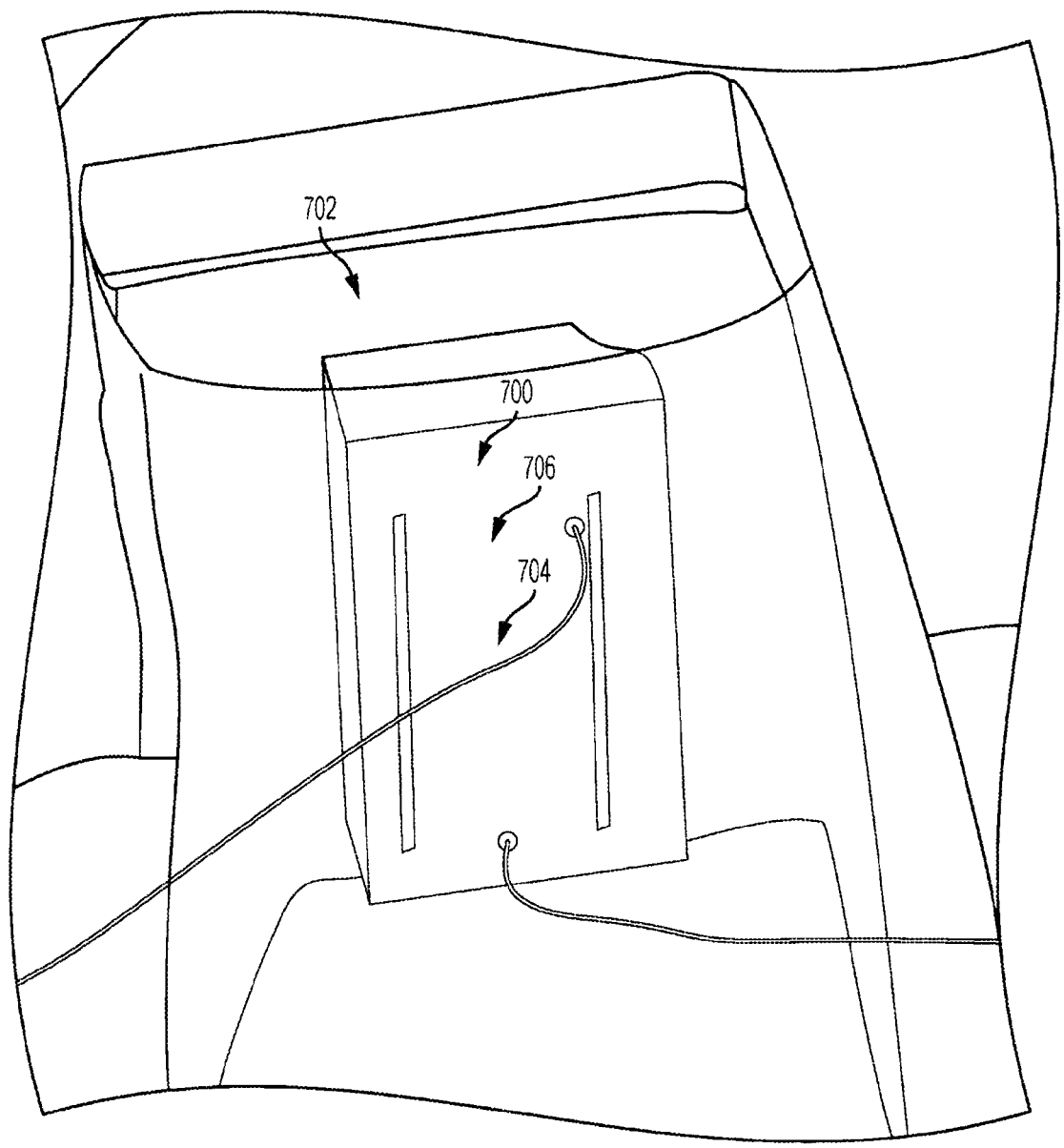
FIG. 7 is a photograph of homoepitaxial III-Nitride LED on a bulk semipolar GaN substrate utilizing a ZnO layer of the present invention.

FIG. 7 is a photograph illustrating an embodiment of the present invention where a III-Nitride LED with the semipolar orientiation, (10-1-1) is used. Here, the LED chip 700 again has a lateral (mesa) type architecture corresponding to FIG. 1(b), but has been mounted in a vertical position on a transparent submount 702. A ZnO transparent current spreading layer 704 grown by the aqueous solution method of this invention covers the LED mesa 706. The LED in FIG. 7 is in operation and emitting light in response to DC current injection.

Figures 8A, 8B:
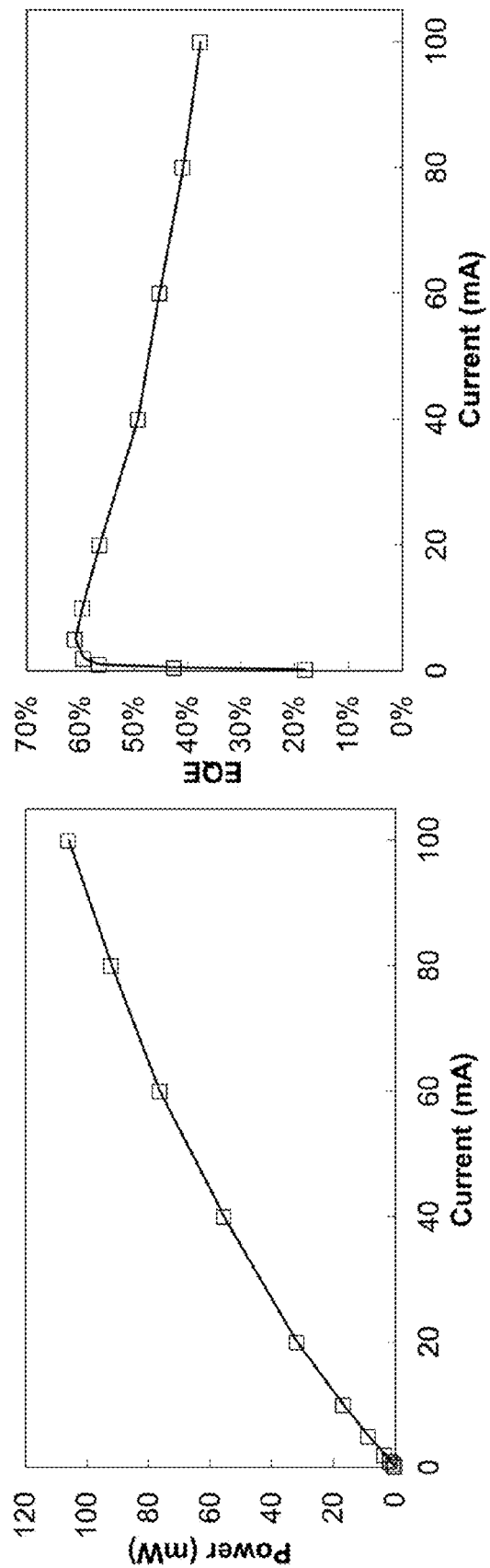
FIG. 8(a) plots output power (milliwatts, mW) vs DC current (milliamps, mA), and FIG. 8(b) plots EQE (%) vs. dc current, for the homoepitaxial c-plane LED of FIG. 6.

FIG. 8(*a*) plots the output power vs. DC current for the LED of FIG. 6, and FIG. 8(*b*) plots the EQE vs. EQE vs. DC current for the semipolar LED of FIG. 6.

Figure 9B:
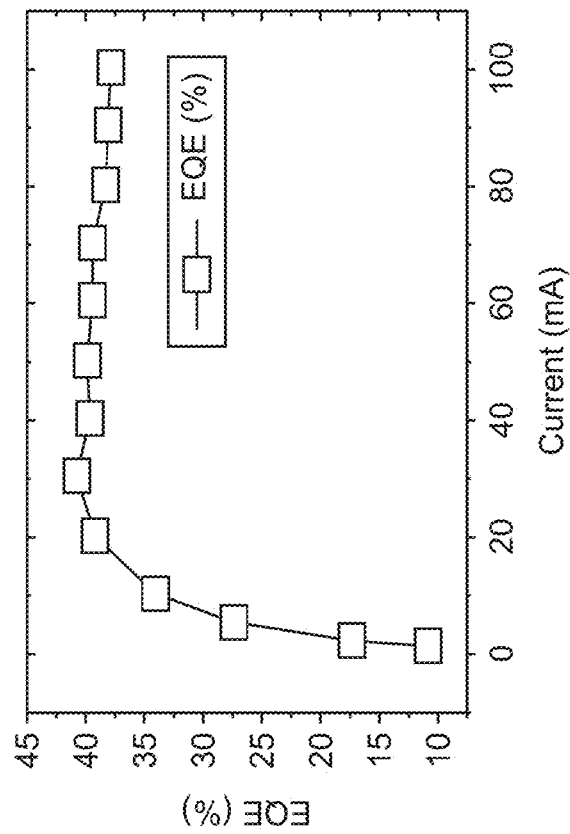
FIG. 9(a) plots output power (milliwatts, mW) vs DC current (milliamps, mA), and FIG. 9(b) plots EQE (%) vs. dc current, for the homoepitaxial semipolar LED of FIG. 7.
Figure 9A:
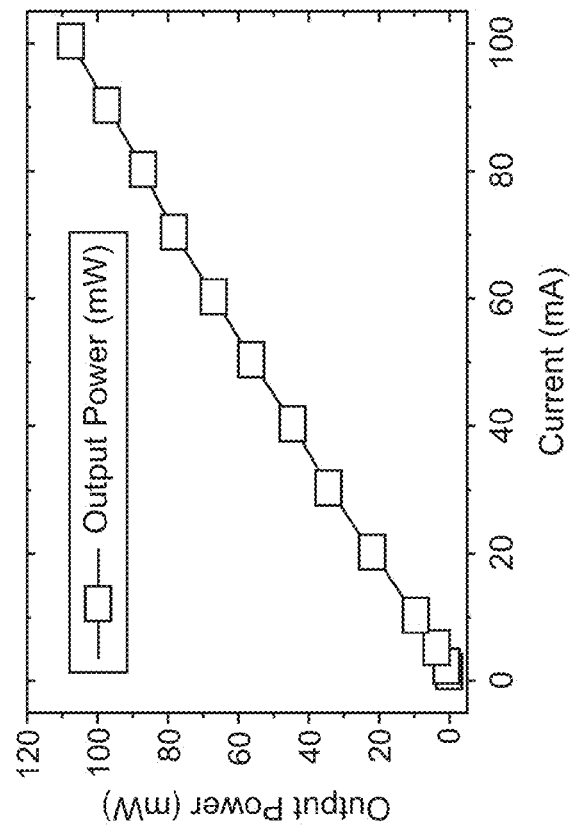

FIG. 9(*a*) plots the output power vs. DC current for the semipolar LED of FIG. 7, and FIG. 9(*b*) plots the EQE vs. DC current for the semipolar LED of FIG. 7.

Heteroepitaxial ZnO Film Synthesis on III-Nitride LEDs

In the embodiment of the present invention illustrated in FIG. 2, a two-step procedure was used to deposit an epitaxial ZnO film from a low temperature aqueous solution on to a III-Nitride LED on a heteroepitaxial sapphire substrate, corresponding to the structure of FIG. 1(*a*).

The epitaxial ZnO current spreading layer was synthesized on the LED wafer using the two-step growth procedure similar to one previously reported for producing films on undoped GaN substrates [11]. This LED utilized was a commercially acquired III-nitride LED wafer grown by metal organic chemical vapor deposition (MOCVD) on a patterned c-plane sapphire substrate.

In the first step, conditions that favor a high nucleation rate of ZnO are used to deposit a thin discontinuous ZnO seed layer on the p-type GaN of the III-nitride LED. Before ZnO deposition, the LED wafer was prepared by cleaning with Acetone, Isopropanol, and deionized water. Any native oxide that may have formed on the wafer's surface was removed with diluted HCl. An approximately 1 cm$^2$ piece of the clean LED wafer (hereinafter LED substrate) was then inserted into a preheated 90° C. solution of 0.2 g zinc nitrate hexahydrate and 0.6 g ammonium nitrate dissolved in 24 ml of distilled water. The substrate insertion was immediately followed by the addition of 0.7 ml of a 1.5 mol/L ammonium hydroxide solution.

The solution and the LED substrate in the solution was then maintained at 90° C. in a sealed vessel for a period of 24 hours, thereby growing the epitaxial ZnO seed layer on the p-type GaN of the LED substrate in the solution. Afterwards, the LED substrate with ZnO seed grown on it was removed, rinsed with water, and dried.

The second step was used to transform the seed layer into the thick, continuous ZnO layer necessary for adequate current spreading. This was accomplished using a growth solution composed of 0.1 g zinc nitrate hexahydrate, 0.05 g sodium citrate dehydrate, 1.25 ml of 15 mol/L ammonium hydroxide, and 24 ml of distilled water.

The ZnO seeded LED substrate was submerged in the growth solution in a sealed vessel which was then placed in a 90° C. oven for 24 hours, thereby growing a thicker epitaxial ZnO film by continuing the growth of the ZnO seed layer. Upon the removal of the substrate, this process resulted in fully coalesced epitaxial ZnO film with thicknesses of approximately 4 µm.

Photolithography was used to create an etch mask to define and protect the LED mesa. The surrounding ZnO layer was then removed using dilute HCl. This was followed by the removal of the p-GaN and active region layers using a Cl$_2$ plasma dry etch.

Again using photolithography to mask the LED, metal contacts of Ti/Al/Ni/Au were deposited on the exposed n-GaN to form the n-contact. Similarly, the p-contact was made with Ti/Au deposited on the surface of the ZnO layer.

For comparison, an LED using a traditional Ni/Au 5/10 nm (5 nm thick Ni layer under a 10 nm thick Au layer) thin metal current spreading layer was also created. For this LED, the mesa was formed using a wet etchant for the metals followed by the same reactive ion etch to remove the GaN. The n-contacts consisted of the same Ti/Al/Ni/Au metal stack deposited on the n-GaN. A thick Ti/Au stack of 10/300 nm (10 nm thick Ti layer under 300 nm thick Au layer) was deposited on the thin metal to act as a bonding pad.

The LEDs were mounted on silver headers using silicone, and the bond pads were connected to the leads by gold wire.

In the embodiment of the present invention illustrated in FIG. 6, an epitaxial ZnO layer was deposited on a III-Nitride LED homoepitaxially grown on a bulk c-plane GaN wafer, corresponding to the structure of FIG. 1(*b*). In this embodiment the same two-step method was used for the ZnO film deposition, with the added step of annealing the seed layer prior to the second ZnO deposition step. The annealing step was performed using a rapid thermal annealing furnace and 20% O$_2$/80% N$_2$ atmosphere, and consisted of a 90 second ramp to 500° C., followed by a 15 minute hold at 500° C. Following ZnO deposition, the same device processing procedure described above was followed.

In the embodiment of the present invention illustrated in FIG. 7, an epitaxial ZnO layer was deposited on a semipolar III-Nitride LED homoepitaxially grown on a (10-1-1) oriented GaN wafer, again corresponding to the structure of FIG. 1(*b*). For this embodiment, the ZnO film was deposited using the deposition method described in Ref [18]. Following ZnO deposition, the same device processing procedure described above was followed.

In an embodiment of the method of Ref [18] ("LOW TEMPERATURE CONTINUOUS CIRCULATION REACTOR FOR THE AQUEOUS SYNTHESIS OF ZnO FILMS, NANOSTRUCTURES, AND BULK SINGLE CRYSTALS") a reactor is used comprising a first zone (wherein Zn(II) is dissolved) and second zone (wherein ZnO is synthesized), and a nucleation rate of the ZnO, either on a substrate or template or as free nuclei, is controlled by varying any combination of the aqueous solution's composition, the first temperature of the first zone and the second temperature of the second zone, a heating or a cooling rate, or the heating and the cooling rates, of the first zone and the second zone, and a rate at which the aqueous solution composition moves between the first zone and the second zone.

The correct solution composition is critical for the continuous circulation reactor to operate. The two most important aspects of the solution composition for this embodiment of the present invention are the pH of the solution and the concentration of appropriate complexing ligands. With an aqueous solution which does not contain the appropriate complexing ligands, ZnO will tend to be more soluble at higher temperatures than lower, and the reactor design of the present invention would not synthesize ZnO. It is therefore necessary to provide a source of ligands to form zinc complexes which act to increase the solubility of ZnO at lower temperatures more than at higher ones.

A working embodiment of the continuous circulation reactor uses a solution containing dissolved ammonia (NH$_3$) to provide amine ligands for this task, but it is intended that embodiments extend to the use of other sources of amine ligands, as well as other ligands which result in a similar ZnO solubility dependence on temperature. Amine is the name given to the NH$_3$ molecular unit when it is functioning as a ligand in a complex. Aqueous solutions of ammonia dissolved in water are also commonly referred to as an ammonium hydroxide (NH$_4$OH) solution, ammonia water, aqua ammonia, household ammonia, or simply ammonia. Ammonia ligands can also be supplied to an aqueous solution by dissolving ammonium salts. Examples include, but are not limited to, simple inorganic and organic salts such as ammonium chloride (NH$_4$Cl), ammonium nitrate ($NH_4NO_3$), ammonium acetate ($CH_3COONH_4$), ammonium carbonate (($NH_4)_2CO_3$), Triammonium citrate (($NH_4$)$_3C_6H_5O_7$), etc. Ammonia ligands could also be supplied as part of a soluble coordination compound or double salt. Additionally, ammonia ligands could be supplied by the en situ decomposition of another compound, urea or hexamine for example. Other ligands besides amine which form aqueous complexes of Zn(II) and which result in a temperature range of decreasing solubility of ZnO with increasing temperature may also be used. Other ligands likely to behave in this manner include, but are not limited to, water soluble primary amines, secondary amines, tertiary amines, and polyamines. Amines are ammonia based organic compounds where at least one hydrogen is replaced with an alkyl or aryl group. Non-nitrogen containing ligands which form complexes which result in the required solubility behavior for ZnO can also be used.

The present invention is not limited to the exact structures and procedures detailed above. Rather, this invention is intended to include any light emitting diode structure where an epitaxial ZnO layer produced by a low temperature aqueous solution method is used as a transparent current spreading and light extraction layer. The method of the present invention is intended to include any method where epitaxial ZnO is deposited on a III-Nitride surface of a light emitting diode substrate by submerging the surface of the LED in a low temperature aqueous solution, wherein a reaction of dissolved Zn(II) results in the synthesis of said ZnO layer.

Surface Structuring for High Light Extraction

Figure 10:
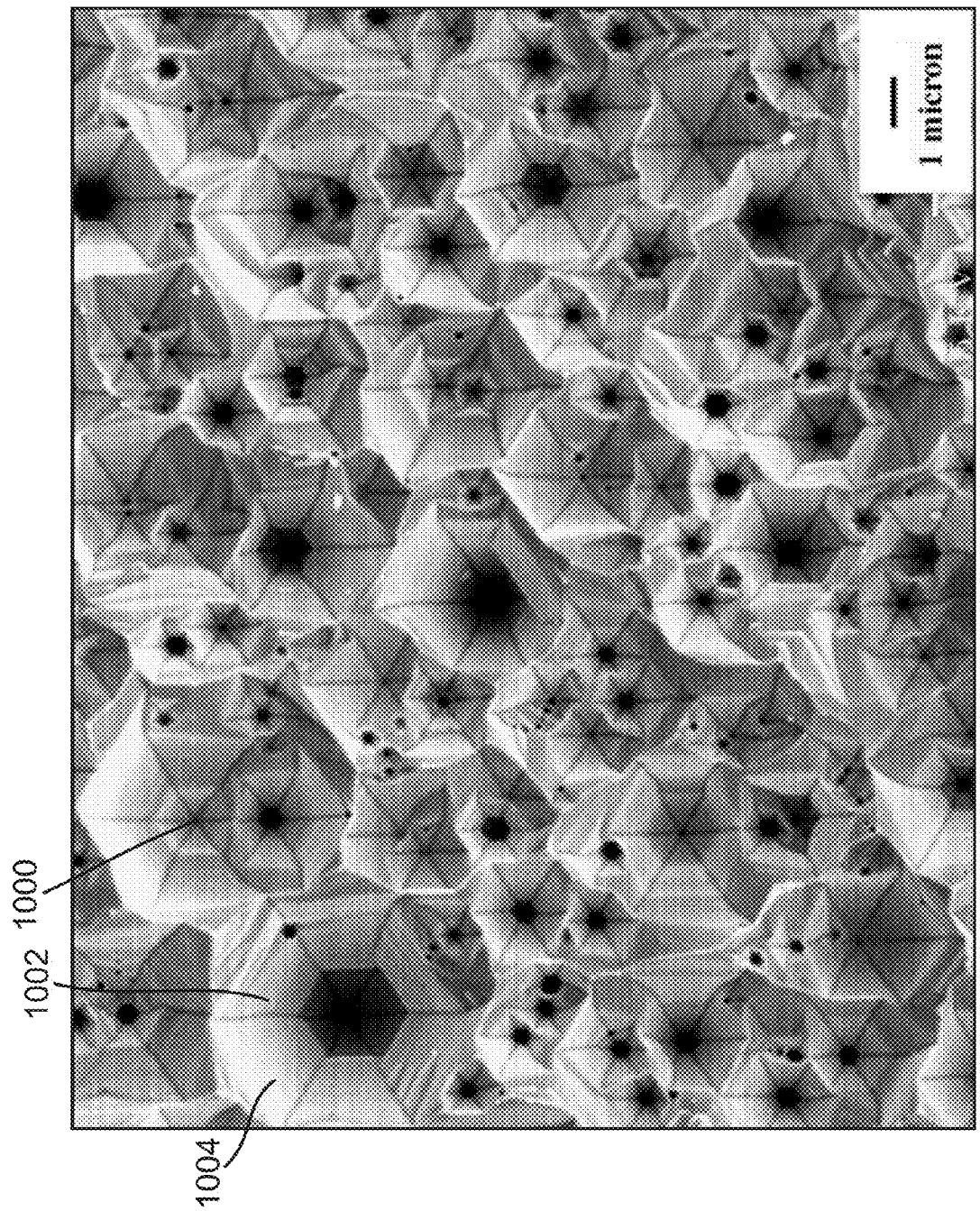
FIG. 10 is a scanning electron microscope (SEM) image of a ZnO thin film grown by the present invention illustrating hexagonal, pyramidal pits formed when the ZnO is etched in $HNO_3$.

The present invention may also comprise roughening or otherwise structuring of the ZnO current spreading layer for the purpose of enhancing light extraction and or heat dissipation from the LED, as shown in FIGS. 9 and 10. This includes both techniques that synthesize the ZnO film with the desired surface roughness or structure (e.g., "as grown"), and techniques that obtain the same by subsequent treatment. One simple way to obtain the type of surface that has been shown to enhance light extraction is to etch the epitaxial ZnO film. Etching the (0001) plane of ZnO films (such as those ZnO films produced by the epitaxial growth on a GaN substrate as described above) in dilute acid is well known to result in the formation of hexagonal pyramidal structures such as those shown in FIG. 10. The angled surfaces of these pyramidal structures may allow more light escape the underlying LED without being internally reflected.

FIG. 10 illustrates the top surface of an epitaxial ZnO film after etching in dilute acid. The etching has resulted in the formation of pits 1000 with inverted hexagonal pyramid like shapes. The walls 1002 of the pits 1000 consist of semipolar planes 1004 of the normally c-plane oriented ZnO crystal. When a ZnO current spreading layer is etched as illustrated in FIG. 10, the angle of the walls 1002 consisting of semipolar planes 1004 is expected to enhancing light extraction by reducing internal reflection of the light generated by the underlying LED.

Figure 11:
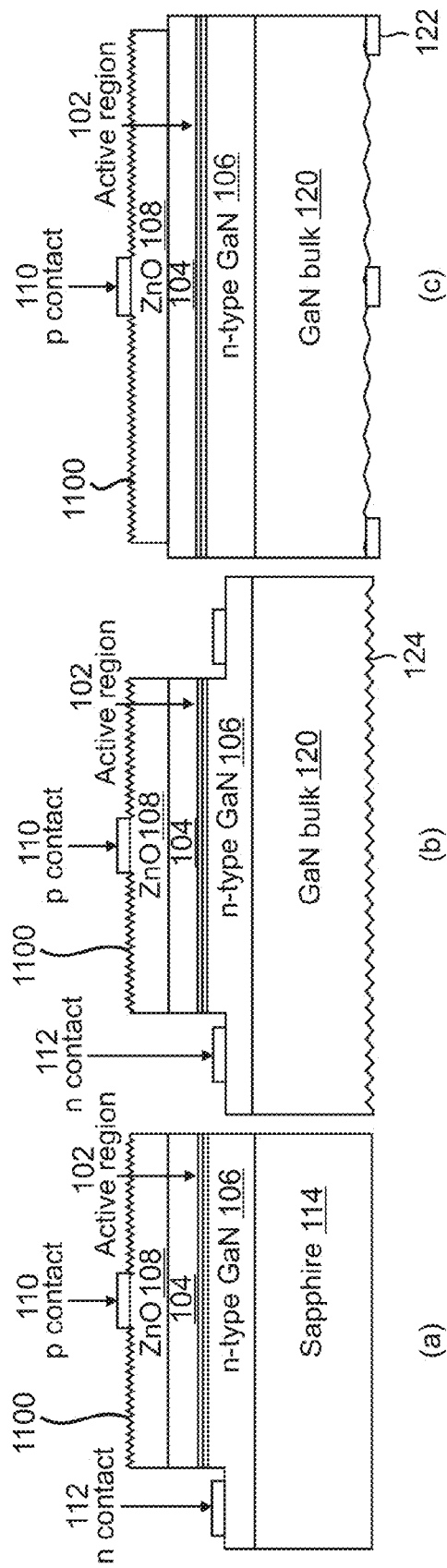
FIG. 11 are schematic cross sectional images of the surface roughened LED structure (a) for the sapphire substrate (b) for the GaN bulk substrate and (c) for the vertical type LED, according to the present invention.

FIG. 11 shows how the three basic device structure types previously shown in FIG. 1 could also utilize a roughened surface 1100 of the ZnO transparent current spreading layers 108. The surface 1100 of the ZnO layer may be roughened, patterned, or structured, either during, or subsequent to, deposition of the ZnO layer 108 on the outermost III-Nitride layer 104, in order to enhance the light extraction of the LED. The roughened, patterned, or structured surface 1100 of the ZnO layer 108 may comprise hexagonal pyramids or pits exposing semipolar the crystal planes of ZnO 108.

Because certain ZnO growth conditions can also lead to pyramidal type structures, it may also be possible to directly synthesize ZnO films with the desired morphology and avoid an additional etch step.

Modifying the Electrical Properties a ZnO Layer After Deposition

Figure 12A:
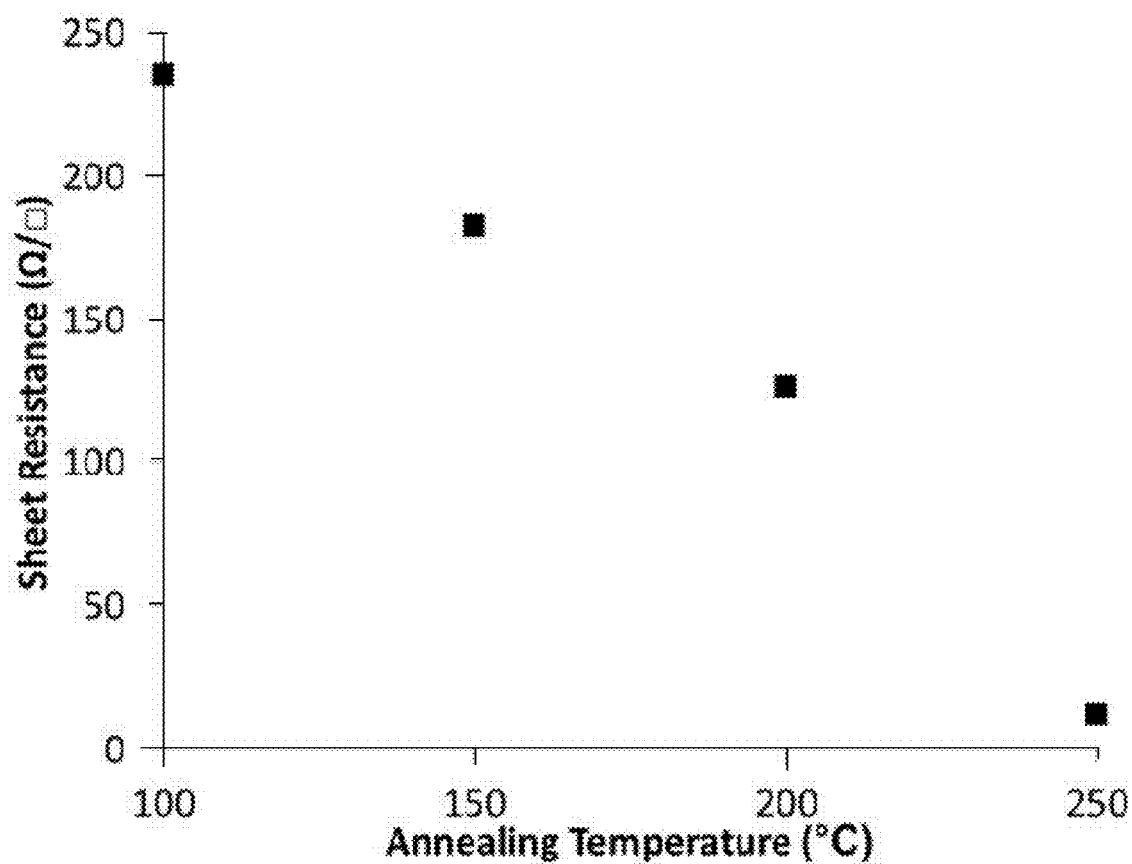
Figure 12B:
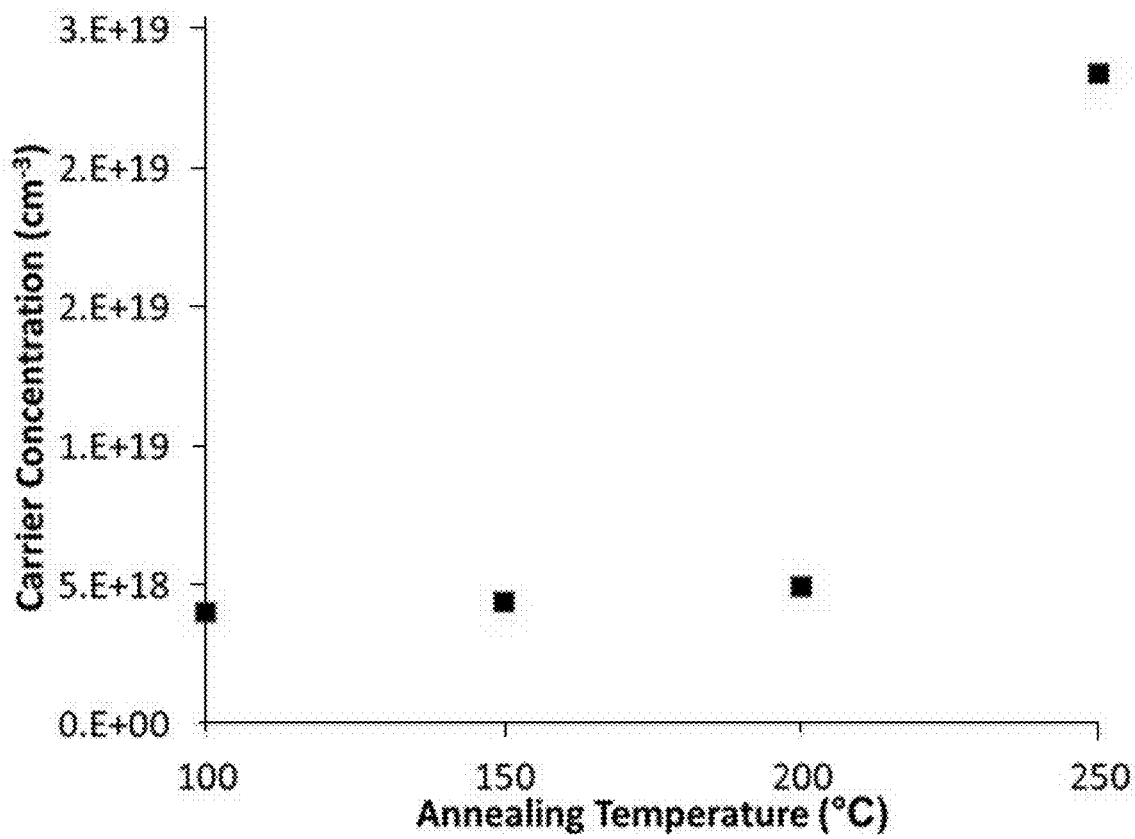
Figure 12C:
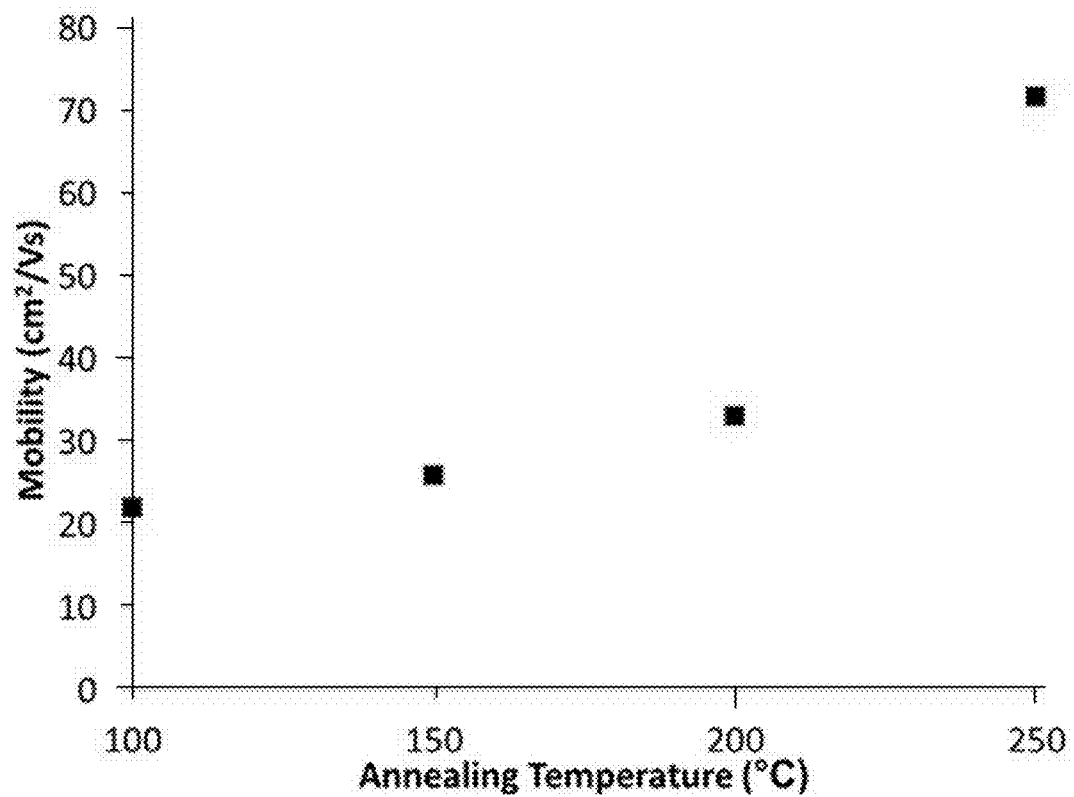

The present invention may also include treatments that serve to modify the electrical properties of the ZnO subsequent to deposition from low temperature aqueous solution. This includes annealing, or otherwise heating, the ZnO film. FIG. 12(a) shows the change in the sheet resistance, FIG. 12(b) shows the change in free electron concentration, and FIG. 12(c) shows the change in electron mobility, of a ZnO film as a function of annealing temperature up to 250° C. All anneals were performed in a rapid thermal annealing furnace, using a 20% $O_2$/80% $N_2$ atmosphere, and a 15 minute hold at the annealing temperature. After annealing at 250° C., the sheet resistance was 12.5 Ω/square, the free electron concentration was $2\times10^{19}$ cm$^{-3}$, and the electron mobility was 70 cm$^2$/Vs.

Process Steps

Figure 13:
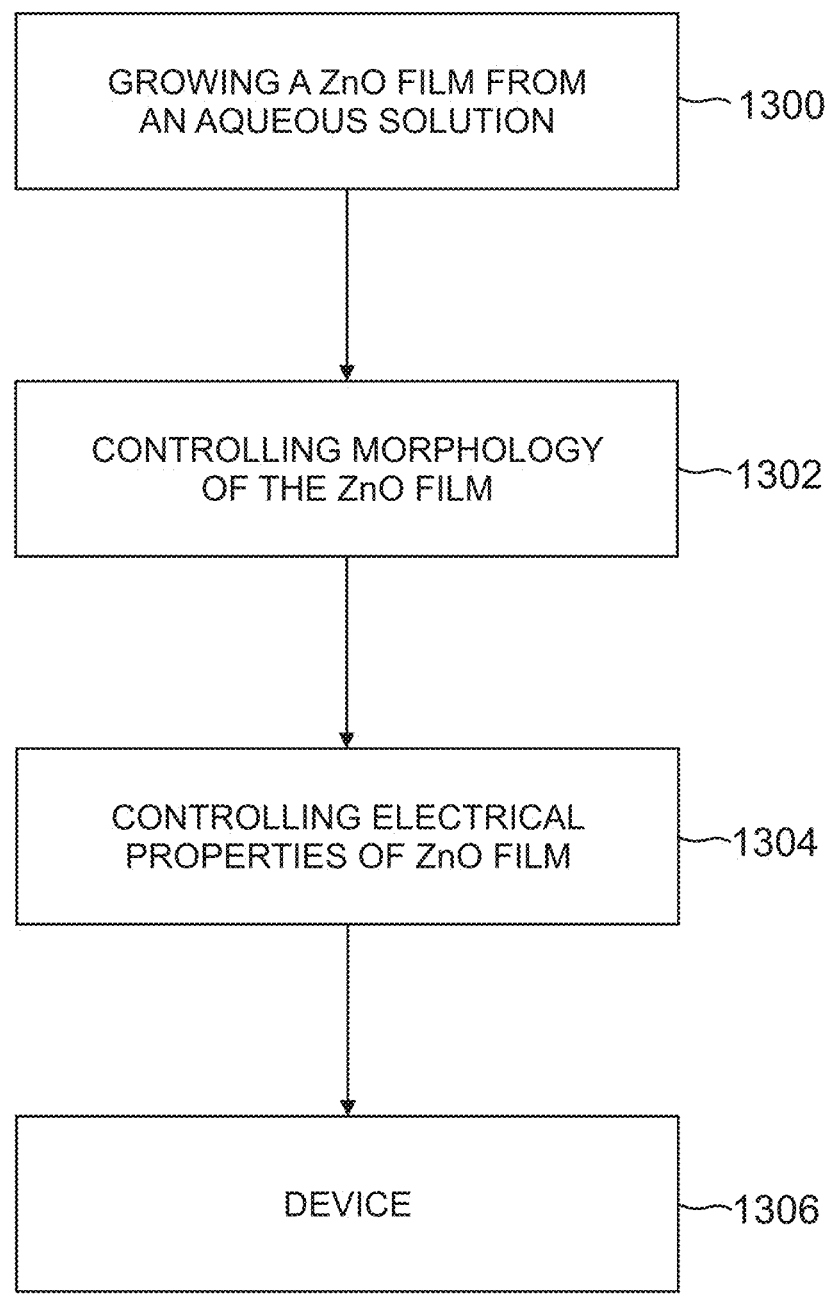
FIG. 13 is a flowchart illustrating a method of fabricating an LED according to one embodiment of the present invention.

FIG. 13 illustrates a method for fabricating an LED with a ZnO current spreading and light extraction layer deposited from a low temperature aqueous solution. The method may comprise the following steps.

Block 1300 represents depositing or growing one or more heteroepitaxial ZnO layers or a heteroepitaxial ZnO film on, e.g., the p-type layer of a III-Nitride LED, from an aqueous solution, wherein the ZnO layer is a transparent current spreading layer.

The deposition may be performed in one or more steps where ZnO is synthesized from an aqueous solution (e.g., growth solution) containing dissolved Zn(II), wherein multiple aqueous deposition steps may be interrupted by non-aqueous steps, e.g., annealing steps. For example, the deposition may comprise submerging a surface of the p-type layer in an aqueous solution to deposit a seed layer, removing the surface from aqueous solution, annealing, and then returning the surface to another aqueous solution for further ZnO deposition. The thickness of the final ZnO layer may be controlled by modifying the conditions of a single aqueous deposition step, or by altering the number sequential aqueous deposition steps.

The deposition of the ZnO layer may be performed in one or more steps, such that, in any one or more of the steps, the reaction of the dissolved Zn(II) to form ZnO is caused, intensified, or otherwise controlled by an increase in a temperature of the growth solution, or by a change in a pH of the growth solution.

The deposition of ZnO from aqueous solution may be performed at an aqueous solution temperature less than the boiling point of water, i.e., a maximum temperature of the aqueous solution less 100° C. Alternatively, the aqueous solution's temperature may be (e.g., just) below the boiling point of the specific aqueous solution used, wherein that boiling point may be below or above 100° C.

The aqueous solution may contain dissolved Zn(II) provided by the dissolution of a soluble salt of ZnO. Alternatively, the dissolved Zn(II) may be provided by the dissolution of ZnO, wherein the ZnO to be dissolved may be ZnO powder.

Block 1302 represents controlling the surface morphology of the ZnO film. The step may comprise forming a planar, roughened, or patterned light transmitting surface of the ZnO film, using the deposition step of Block 1300 (i.e., during the step 1300 of synthesizing the ZnO layers) or using an additional etching step.

The ZnO film or layer may be formed or created with a roughened, patterned, textured, or structured light transmitting surface suitable for increasing light extraction of the light emitted by the LED, wherein the increased light extraction from the ZnO is by diffraction or reduced total internal reflection. The ZnO layer's surface may be formed with structures (e.g., pyramids or pits), having a base angle, width, and height suitable for diffracting, scattering, reducing total internal reflection of the light, or extracting light through photonic crystals.

For example, deposition conditions during Block 1300 may be selected such that the deposition leads to the desired morphology of the ZnO layer, e.g., a planar or a roughened surface.

For example, the morphology of the ZnO layers produced may be modified by an addition of additives to the aqueous solution, wherein the additives include one or more of the following: metal citrate salts, citric acid, surfactants, polymers, biomolecules, or other molecules that interact with one or more surfaces of the ZnO layers. The morphology of the ZnO layers produced by the addition of the additives to the aqueous solution may enhance light extraction from the LED.

The aqueous solution may contain dissolved surfactants and the morphology may be controlled by using and controlling the type and the amounts of one or more surfactants in the solution. For example, the present invention may control the morphology of ZnO crystallites using citrate ions as a surfactant. The morphology may also be controlled by modifying the pH of the solution, or by the presence of molecules that modify the solubility of ZnO in the solution, or growth rate of ZnO from solution, by forming complexes with Zn(II). For example, the morphology of the ZnO film may be controlled by changing the pH and ammonia concentration of the solution.

Conditions used during the step of depositing or synthesizing the ZnO layers may result in the ZnO surfaces comprising hexagonal pyramids or pits exposing semipolar planes of the ZnO layers.

Alternatively, or in addition, etching of the ZnO grown film may be used to form the roughened/patterned/structured light transmitting surface of the ZnO layer that is suitable for enhancing light extraction as described above. Thus, the creation of the roughened, patterned, or structured surface may include one or more steps involving a removal of material from a preformed ZnO layer by means of physical or chemical etching.

Conditions of the physical or chemical etching used may result in the ZnO surfaces of the ZnO layers comprising hexagonal pyramids or pits exposing semipolar planes of the ZnO layers. Etching the basal planes of ZnO, for example, with a dilute acid, such diluted as $HNO_3$ or HCl, may produce either hexagonal pyramids on the oxygen (000-1) basal plane, and/or hexagonal, pyramidal pits on the Zn basal plane. It has been reported [17] that the oxygen (000-1) basal plane of ZnO etches rapidly because of the presence of dangling oxygen electron bonds. Therefore, the etched surface appears uniform and is marked by small hillocks (hexagonal pyramids) formed with pyramidal (10-11)) planes. The (0001) face, in contrast, etches slowly because the surface zinc atoms have no dangling electron bonds. Hexagonal pits, which expose surfaces that etch more rapidly than the (0001) basal plane, form on the Zn (0001) basal plane, and reveal pyramidal semipolar planes.

In another example, the method may comprise etching the III-Nitride surface of the LED, or creating a template layer on the III-Nitride surface of the LED; and synthesizing or depositing the ZnO layers (in the step of Block 1300) on the template layer or on the etched III-Nitride surface, wherein the roughened, patterned, or structured ZnO surfaces are a result of the etching or template creation step performed prior to the step of synthesizing the ZnO layers.

Block 1304 represents controlling the electrical properties of the ZnO layer. For example, one or more components may be supplied in the aqueous solution for a purpose of incorporating one or more dopants into the ZnO layers.

The step may comprise controlling either or both the electrical carrier concentration and the electrical carrier mobility in the ZnO film, and/or the conductivity or sheet resistance of the ZnO film, using the deposition step of Block 1300, the surface morphology step of 1302, and/or using an additional step. The electrical carrier concentration, the electrical carrier mobility, the conductivity, and the sheet resistance of the ZnO film, henceforth referred to as the electrical properties, will affect the current spreading ability of the film as well as the final electrical characteristics of the LED device incorporating the ZnO film.

The electrical properties of the ZnO film may be controlled by modifying the conditions used during deposition. Conditions of aqueous solution temperature, pH, and component concentration may be used to control the electrical properties of the ZnO film. The number of aqueous deposition steps and the thickness of ZnO film produced in each step may be used to control the electrical properties.

The presence of dopants in the aqueous solution, wherein those dopant are incorporated into the deposited ZnO film, may be used to modify the electrical properties of the ZnO film. For example, dopants from the group B, Al, Ga, or In may be incorporated into the ZnO film by providing dissolved B, Al, Ga, or In in the aqueous growth solution, such that the electrical properties of the ZnO film are modified.

The electrical properties of the ZnO film may be controlled by the steps performed subsequent to one or more aqueous deposition or synthesis steps. For example, the electrical properties of a ZnO film may be modified by one or more annealing steps performed subsequent to the first aqueous deposition step, wherein the annealing step may comprise of heating the ZnO film, e.g., to a temperature greater than the temperature used during the step of depositing in the aqueous solution.

Block 1306 represents the end result of the method, a device such as an LED. The present invention includes a transparent current spreading layer comprising, in part or wholly, of an epitaxial ZnO film deposited from a low temperature aqueous solution. The ZnO layer used as a transparent current spreading layer for the device is typically transparent to light wavelengths generated and emitted by the device. The ZnO transparent conducting spreading layer (s) deposited by the present invention on the LEDs/devices, may, in some examples, have a sheet resistance lower than 250 Ohms/square, more preferably lower than 50 Ohms/square. The ZnO transparent conducting spreading layer(s) deposited by the present invention on the LEDs/devices may, in some examples, have a transparency greater than 75% at the wavelength generated by the LED, and more preferably greater than 90%.

Any steps prior or subsequent to Blocks 1300, 1302, 1304 that may be required to complete Block 1306 may be undertaken without departing from the scope of the present invention.

ZnO Film Properties

The electrical properties of ZnO will be important for many applications. The carrier type, concentration, and mobility of epitaxial ZnO films fabricated using the present invention have been measured using van der Pauw method Hall effect measurements. The films measured were not intentionally doped. Like most unintentionally doped ZnO, the films display n-type conductivity behavior. Carrier concentrations of as deposited films produced with the current invention were in the $10^{18}$-$10^{19}$ range. The most likely source of electron donors, i.e., the n-type dopant, is hydrogen incorporated into the ZnO films during synthesis. The theoretical role of hydrogen in ZnO is described in "Hydrogen as a Cause of Doping in Zinc Oxide," by Chris G. Van de Walle, Physical Review Letters (2000), 85(5), pp. 1012-1015. Doping with hydrogen supplied by the aqueous growth solution, allows ZnO films with relatively high carrier concentrations to by synthesized without intentionally doping with a column IIIb element like B, Al, Ga, or In. The electron mobility in as deposited films has typically been measured to be in the 25-50 $cm^2$/Vs range. These electron mobility values roughly correspond to the range seen in vapor deposited films, and achieve about 25-50% of the electron mobility observed in bulk single crystals with roughly the same carrier concentration, according to "Resistivity of Polycrystalline Zinc Oxide Films: Current Status and Physical Limit", by K. Elmmer, Journal of Physics. D (2001), 34(21), pp. 3097-3108, indicating that the ZnO films are of good quality.

Another important property for applications where the ZnO acts as a transparent conductor, such as when integrated onto a III-N LED as described above, is transparency to visible light. ZnO films produced using the current invention have been shown to transmit over 90% of the light in the visible spectrum. For example, an epitaxial ZnO film fabricated with the current invention with a thickness of approximately 5 µm was measured to transmit greater than 92% of the total light in the range of 390 nm to 700 nm, which roughly corresponds to wavelengths visible to the human eye. The same film was measured to absorb between 94% and 95% of the ultra violet light with wavelengths between 300 nm and 375 nm. The sharp onset of absorption below 375 nm corresponds to a direct optical band gap of 3.31 eV, which is the value typically reported for hexagonal wurtzite structure crystalline ZnO. The high level of absorption at wavelengths below the band gap and high transparency above the band gap indicates a high quality film. For example, the films created with the present invention transmit more visible light than the undoped, or Ga doped ZnO films produced by pulsed laser deposition in Cheung, Jeffery T., "Transparent and Conductive Zinc Oxide Film with Low Growth Temperature", U.S. Pat. No. 6,458,673 B1, 2002.

Advantages and Improvements

This invention is expected to help increase the efficiency and brightness of III-Nitride LEDs at a lower cost than the current state of the art methods.

The invention communicated here presents several important advantages over the current state of the art. The present invention has clearly demonstrated that the use of ZnO transparent current spreading layers can significantly enhance the light extraction from III-Nitride LEDs compared to conventional Ni/Au layers (e.g., by about a factor of 2). The present invention has also shown that ZnO current spreading layers perform as well or better when compared to a current spreading layer fabricated from ITO, the current industry standard for TCO films. However, ZnO has several advantages over ITO in terms of cost. First, in terms of raw materials, the cost of Zn is orders of magnitude less than Indium (In), the primary component of ITO. Second, ZnO can be deposited and etched using aqueous solution based methods performed near or at atmospheric temperature and pressure. Compared to the vapor phase methods typically used for processing ITO, aqueous solution processing of ZnO films provides potential cost advantages in equipment, energy, chemical precursors, and throughput. These same advantages also apply when comparing the present method to ZnO films deposited by vapor phase methods.

REFERENCES

The following references are incorporated by reference herein.

[1] C. G. Van de Walle and J. Neugebauer: Nature 423 (2003) 626.

[2] A. Murai, D. B. Thompson, H. Masui, N. Fellows, U. K. Mishra, S. Nakamura, and S. P. DenBaars: Appl. Phys. Lett. 89 (2006) 171116.

[3] A. Murai, D. B. Thompson, H. Masui, N. Fellows, U. K. Mishra, S. Nakamura, and S. P. DenBaars: Phys. Status Solidi C 4 (2007) 2756.

[4] D. B. Thompson, A. Murai, H. Masui, N. Fellows, S. P. DenBaars, U. K. Mishra, and S. Nakamura: ABSt 7th Int. Conf. Nitride Semiconductors, 2007, A3, p. 12.

[5] T. Margalith, O. Buchinsky, D. A. Cohen, A. C. Abare, M. Hansen, S. P. DenBaars and L. A. Coldren: Appl. Phys. Lett. 74 (1999) 3930.

[6] K.-M. Chang, J.-Y. Chu and C.-C. Cheng: Solid-State Electron. 49 (2005) 1381.

[7] K. Nakahara, K. Tanuma, M. Sakai, D. Nakagawa, N. Ito, M. Sonobe, H. Takasu, H. Tampo, P. Fons, K. Matsubara, K. Iwata, A. Yamada and S. Niki: Jpn. J. Appl. Phys. 43 (2004) L180.

[8] J. O. Song, K.-K. Kim, S.-J. Park and T.-Y. Seong: Appl. Phys. Lett. 83 (2003) 479.

[9] R. H. Horng, C. C. Yang, J. Y. Wu, S. H. Huang, C. E. Lee, and D. S. Wuu: Appl. Phys. Lett. 86, 221101 (2005).

[10] Jinn-Kong Sheu, Y. S. Lu, Min-Lum Lee, W. C. Lai, C. H. Kuo and Chun-Ju Tun: Appl. Phys. Lett. 90, 263511 (2007).

[11] J. H. Kim, E. M. Kim, D. Andeen, D. Thompson, S. P. DenBaars, and F. F. Lange: Adv. Funct. Mater. 17 (2007) 463.

[12] Daniel B. Thompson, Jacob J. Richardson, Steven P. DenBaars, and Frederick F. Lange, entitled "Light Emitting Diodes with ZnO Current Spreading Layers Deposited from a Low Temperature Aqueous Solution," Applied Physics Express 2 (2009) 042101, published online on Mar. 19, 2009.

[13] Presentation Slides given by Jacob Richardson, entitled "Low Temperature Aqueous Deposition of ZnO on GaN LEDs," at the 2009 Annual Review for the Solid State Lighting and Energy Center (SSLEC), University of California, Santa Barbara (Nov. 5, 2009).

[14] W. J. Li, et al., J. Cryst. Growth 203, p. 186 (1999).

[15] J. Norwig, et al., Chem. Mater., 10.1998, pp. 460-463.

[16] Z. R. Tian, et al., Nature Materials, 2(12) 2003, pp. 821-826.

[17] M. N. Mariano, R. E. Hanneman, "Crystallographic Polarity of ZnO Crystals," J. Appl. Phys., 34, p. 384 (1961).

[17] Andeen, et al., J. Crys. Grow., 259, 2003, pp. 103-109.

[18] U.S. Utility patent application Ser. No. 12/761,246, filed on Apr. 15, 2010, by Jacob J. Richardson and Frederick F. Lange, entitled "LOW TEMPERATURE CONTINUOUS CIRCULATION REACTOR FOR THE AQUEOUS SYNTHESIS OF ZnO FILMS, NANO-STRUCTURES, AND BULK SINGLE CRYSTALS,"

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method of fabricating ZnO layers on a III-Nitride light emitting diode (LED), comprising:
    obtaining the III-Nitride LED comprising a light emitting active layer between a III-Nitride p-type layer and a III-Nitride n-type layer;
    obtaining a first aqueous solution having a first composition containing dissolved Zn(II);
    heating the first aqueous solution to a first temperature less than 100° C.;
    synthesizing and depositing an epitaxial ZnO seed layer, comprising submerging a III-nitride surface of the III-Nitride LED in the first aqueous solution at the first temperature, changing a pH of the first aqueous solution after the submerging to form a first pH, and using a chemical reaction involving the dissolved Zn(II) under conditions including the first pH, the first composition, and the first temperature, to form the epitaxial ZnO seed layer on the III-Nitride surface of the III-Nitride LED;
    annealing the epitaxial ZnO seed layer at a second temperature higher than 100 degrees Celsius;
    after the annealing, synthesizing and depositing one or more ZnO layers, comprising submerging the epitaxial ZnO seed layer in a second aqueous solution having a second pH and a second composition containing dissolved Zn(II), to form the one or more ZnO layers on the epitaxial ZnO seed layer; and
    fabricating an n-contact to the n-type III-nitride layer and fabricating a p-contact to the one or more ZnO layers.

2. The method of claim 1, wherein a maximum temperature of the aqueous solution is less than 100° C.

3. The method of claim 1, wherein the dissolved Zn(II) in the first and second aqueous solutions is supplied by dissolving a water soluble salt of Zn(II).

4. The method of claim 1, wherein the dissolved Zn(II) in the first and second aqueous solutions is supplied by dissolving ZnO.

5. The method of claim 1, wherein the first and second aqueous solutions are growth solutions and deposition of the one or more ZnO layers is performed in a plurality of steps, such that, in any one of the steps, the reaction of the dissolved Zn(II) to form ZnO is caused, intensified, or otherwise controlled by an increase in the temperature of the first and second aqueous solutions and/or by a change in the first and second pH of the first and second aqueous solutions.

6. The method of claim 1, further comprising controlling a morphology of the one or more ZnO layers by creating one or more roughened, patterned, and/or structured surfaces of the one or more ZnO layers suitable for enhancing light extraction of light emitted by the LED.

7. The method of claim 6, wherein the creation of the roughened, patterned, and/or structured surfaces is by one or more steps involving a removal of material from the preformed one or more ZnO layers by means of physical or chemical etching.

8. The method of claim 6, wherein the roughened, patterned, and/or structured surfaces of the one or more ZnO layers are created during the step of synthesizing the ZnO layer.

9. The method of claim 7, wherein conditions of the physical or chemical etching used result in the ZnO surfaces of the one or more ZnO layers comprising hexagonal pyramids and/or pits exposing semipolar planes of the one or more ZnO layers.

10. The method of claim 6, wherein the roughened, patterned, and/or structured surfaces are a result of conditions used during the step of synthesizing the one or more ZnO layers.

11. The method of claim 10, wherein the conditions used during the step of depositing or synthesizing the one or more ZnO layers result in the ZnO surfaces comprising hexagonal pyramids and/or pits exposing semipolar planes of the one or more ZnO layers.

12. The method of claim 6, further comprising:
    etching the III-Nitride surface, or creating a template layer on the III-Nitride surface; and
    performing the step of synthesizing and depositing the epitaxial ZnO seed layer on the template layer or on the etched III-Nitride surface, wherein the roughened, patterned, and/or structured ZnO surfaces are a result of the etching or template creation step performed prior to the step of synthesizing the ZnO layers.

13. The method of claim 1, wherein a morphology of the one or more ZnO layers produced is modified by an addition of one or more additives to the aqueous solution, wherein the one or more additives are selected from metal citrate salts, citric acid, surfactants, polymers, biomolecules, and other molecules that interact with one or more surfaces of the one or more ZnO layers.

14. The method of claim 13, wherein the morphology of the one or more ZnO layers produced by the addition of the one or more additives to the aqueous solution enhances light extraction from the LED.

15. The method of claim 1, wherein the second aqueous solution is a growth solution, and one or more components are supplied in the second aqueous solution for a purpose of incorporating one or more dopants into the one or more ZnO layers.

16. The method of claim 15, wherein at least one of the dopants is selected from the group consisting of B, Al, Ga, and In.

17. The method of claim 15, wherein incorporation of the dopants modifies one or more electrical properties of the one or more ZnO layers.

18. The method of claim 1, wherein at least one annealing step is performed subsequent to the step of depositing the one or more ZnO layers in the aqueous solution.

19. The method of claim 18, wherein the annealing step modifies one or more electrical properties of the one or more ZnO layers.

20. The method of claim 18, wherein the annealing step comprises heating the one or more ZnO layers to a temperature greater than 200 degrees Celsius.

21. The method of claim 1, wherein the one or more ZnO layers have a sheet resistance of no more than 12.5 Ohms per square.

22. The method of claim 1, wherein the depositing of the one or more ZnO layers comprises depositing multiple ZnO layers, wherein each ZnO layer is annealed prior to deposition of the next ZnO layer.

23. The method of claim 22, wherein each of the ZnO layers is annealed at a different temperature.

24. The method of claim 1, wherein the one or more ZnO layers are deposited on a bulk Gallium Nitride (GaN) substrate.

25. The method of claim 1, wherein the one or more ZnO layers have at least a 4 micrometer thickness.

26. The method of claim 1, performed in a reactor comprising a first zone and a second zone, wherein:
the Zn(II) is dissolved in the first zone, and
the ZnO layers are synthesized in the second zone,
a nucleation rate of the ZnO in the epitaxial ZnO layer and in the one or more ZnO layers is controlled by varying any combination of the first and second aqueous solutions including complexing ligands, a first temperature of the first zone and a second temperature of the second zone, a heating or a cooling rate, or the heating and the cooling rate, of the first zone and the second zone, and a rate at which the aqueous solution moves between the first zone and the second zone, and
the synthesis of the ZnO in the epitaxial ZnO layer and in the one or more ZnO layers is caused by a reduction in solubility of the ZnO in the first and second aqueous solutions at the second temperature of the second zone compared to the first temperature of the first zone as a result of the complexing ligands acting to increase the ZnO solubility at the first temperature more than at the second temperature.

27. A method of fabricating ZnO layers on a III-Nitride light emitting diode (LED), comprising:
obtaining the III-Nitride LED comprising a light emitting active layer between a III-Nitride p-type layer and a III-Nitride n-type layer;
obtaining a first aqueous solution having a first composition containing dissolved Zn(II);
heating the first aqueous solution to a first temperature less than 100° C.;
synthesizing and depositing an epitaxial ZnO seed layer, comprising submerging a III-nitride surface of the III-Nitride LED in the first aqueous solution at the first temperature, adding ammonium hydroxide to the first aqueous solution after the submerging and forming a first pH of the first aqueous solution after the submerging, and using a chemical reaction involving the dissolved Zn(II) under conditions including the first pH of the first aqueous solution, to form the epitaxial ZnO seed layer on the III-Nitride surface of the III-Nitride LED;
annealing the epitaxial ZnO seed layer at a temperature higher than 100 degrees Celsius;
after the annealing, synthesizing and depositing one or more ZnO layers, comprising submerging the epitaxial ZnO seed layer in a second aqueous solution having a second pH and a second composition containing dissolved Zn(II), under conditions including the second pH to form the one or more ZnO layers on the epitaxial ZnO seed layer;
fabricating an n-contact to the n-type III-nitride layer and fabricating a p-contact to the one or more ZnO layers.

* * * * *